(12) United States Patent
Cheng et al.

(10) Patent No.: US 9,356,027 B1
(45) Date of Patent: May 31, 2016

(54) DUAL WORK FUNCTION INTEGRATION FOR STACKED FINFET

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/708,885

(22) Filed: May 11, 2015

(51) Int. Cl.
*H01L 27/092* (2006.01)
*H01L 27/12* (2006.01)
*H01L 21/8238* (2006.01)

(52) U.S. Cl.
CPC .... *H01L 27/0924* (2013.01); *H01L 21/823821* (2013.01); *H01L 27/1211* (2013.01)

(58) Field of Classification Search
CPC . H01L 27/1203; H01L 27/12; H01L 27/1214; H01L 21/84; H01L 29/78621; H01L 21/8221; H01L 27/0688; H01L 27/1108; H01L 27/11
USPC .......................................... 257/350; 438/152
See application file for complete search history.

(56) References Cited

U.S. PATENT DOCUMENTS

| | | | |
|---|---|---|---|
| 8,450,804 B2 | 5/2013 | Sekar et al. | |
| 8,536,023 B2 | 9/2013 | Or-Bach et al. | |
| 8,581,349 B1 | 11/2013 | Sekar et al. | |
| 8,642,416 B2 | 2/2014 | Or-Bach et al. | |
| 2006/0220134 A1* | 10/2006 | Huo | H01L 21/84 257/351 |
| 2010/0219479 A1* | 9/2010 | Nuttinck | H01L 29/66795 257/369 |
| 2014/0091361 A1* | 4/2014 | Goel | H01L 21/845 257/190 |

OTHER PUBLICATIONS

Batude, P., et al., "3D monolithic integration" 2011 IEEE International Symposium on Circuits and Systems (ISCAS), (May 15-18, 2011) pp. 2233-2236.

* cited by examiner

*Primary Examiner* — Walter H Swanson
(74) *Attorney, Agent, or Firm* — Scully, Scott, Murphy & Presser, P.C.; Steven J. Meyers

(57) ABSTRACT

A three-dimensional stacked fin complementary metal oxide semiconductor (CMOS) device having dual work function metal gate structures is provided. The stacked fin CMOS device includes a fin stack having a first semiconductor fin over a substrate, a dielectric fin atop the first semiconductor fin and a second semiconductor fin atop the dielectric fin, and a gate sack straddling the fin stack. The gate stack includes a first metal gate portion surrounding a channel portion of the first semiconductor fin and a second metal gate portion surrounding a channel portion of the second semiconductor fin. The first metal gate portion has a first work function suitable to reduce a threshold voltage of a field effect transistor (FET) of a first conductivity type, while the second gate portion has a second work function suitable to reduce a threshold voltage of a FET of a second conductivity type opposite the first conductivity type.

9 Claims, 29 Drawing Sheets

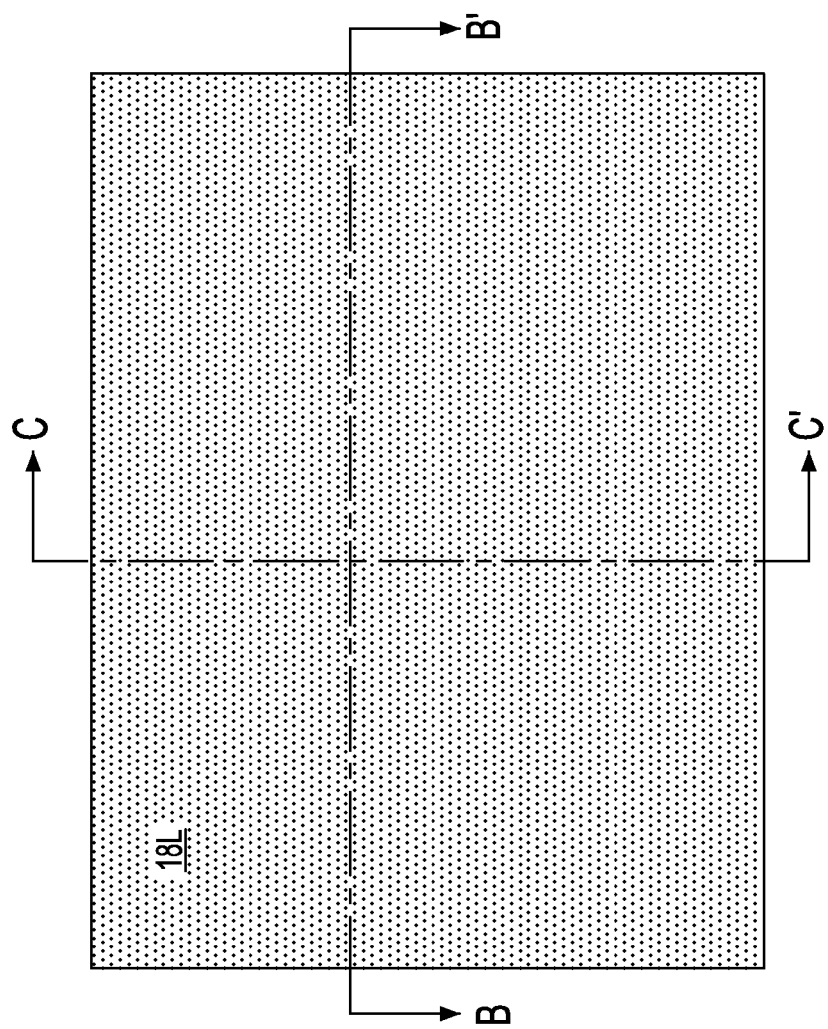

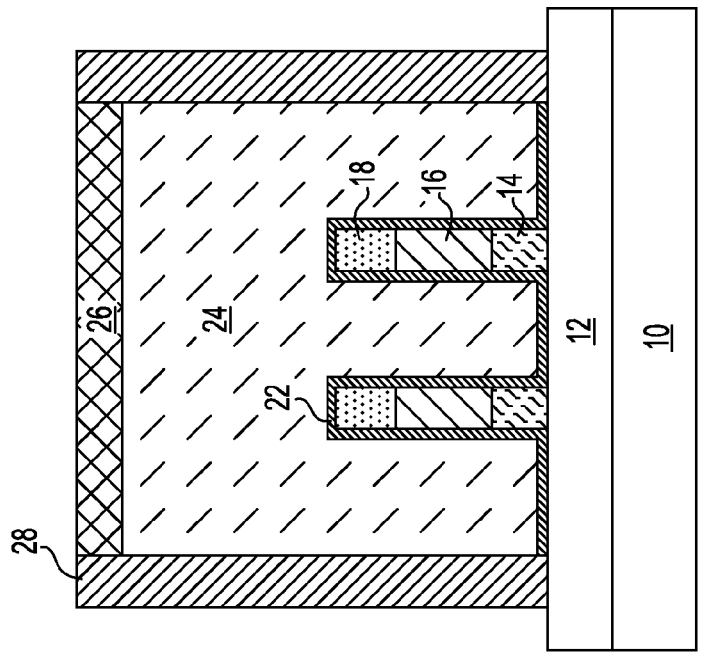
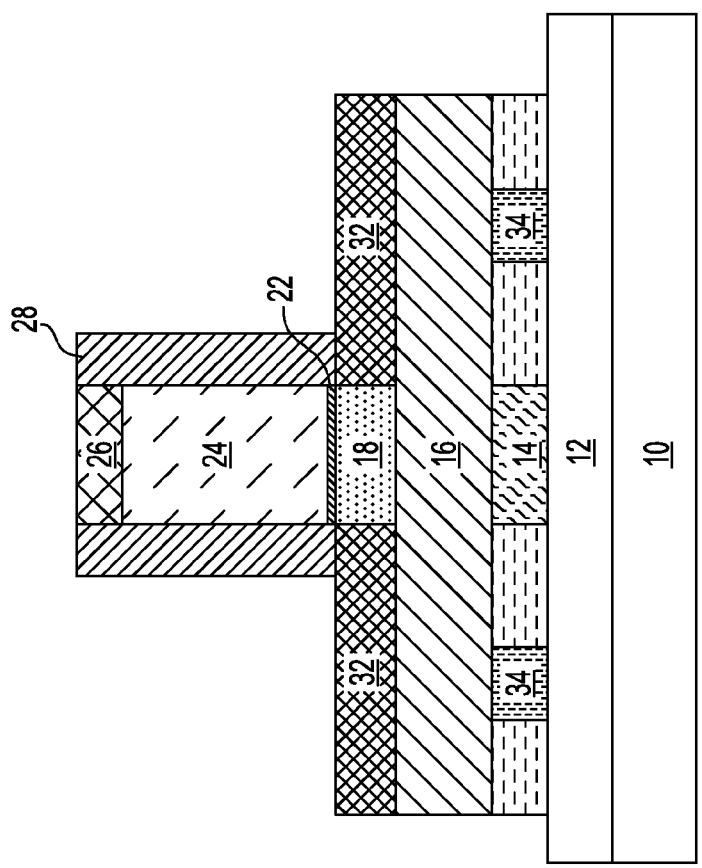
FIG. 4C
FIG. 4B

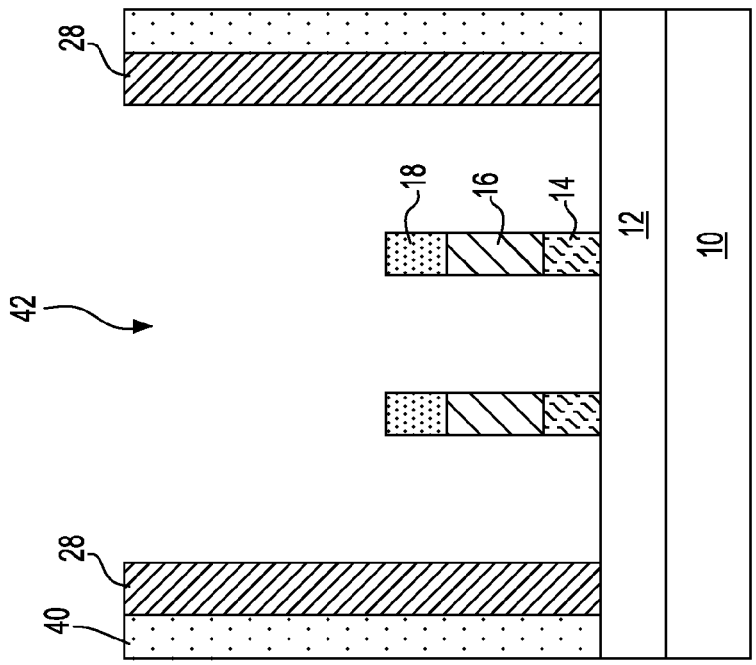
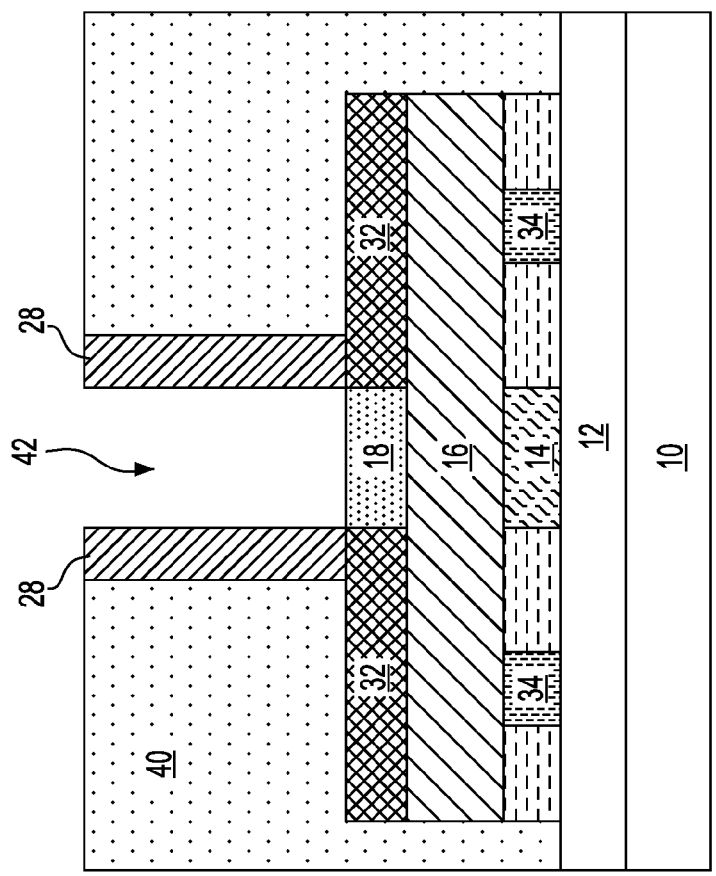
FIG. 6C
FIG. 6B

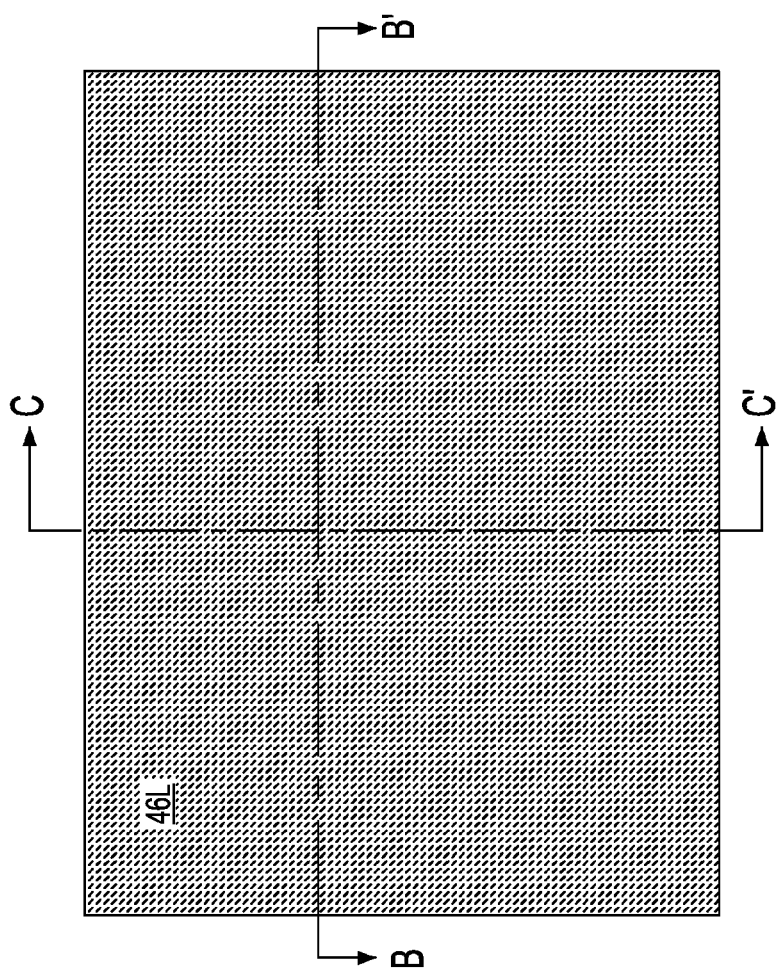

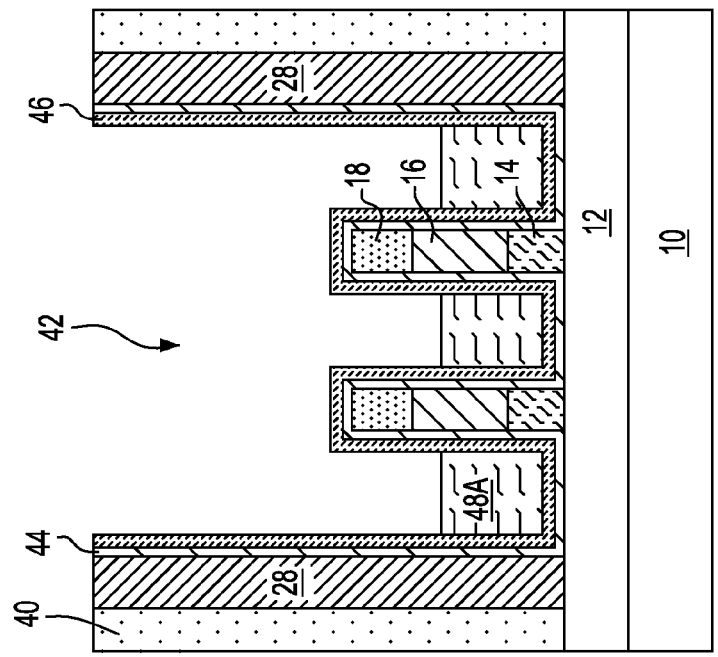
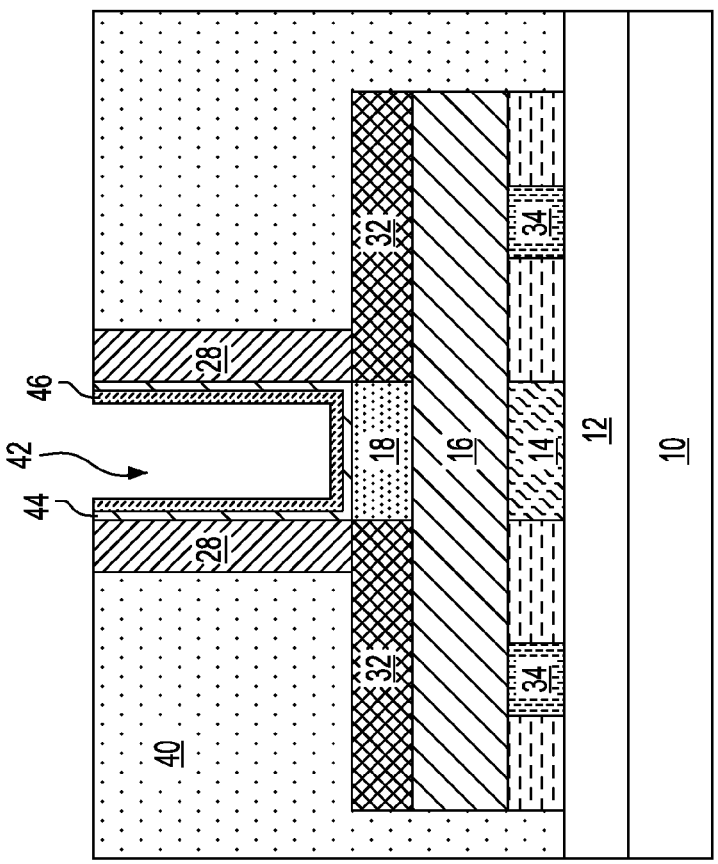
FIG. 9C
FIG. 9B

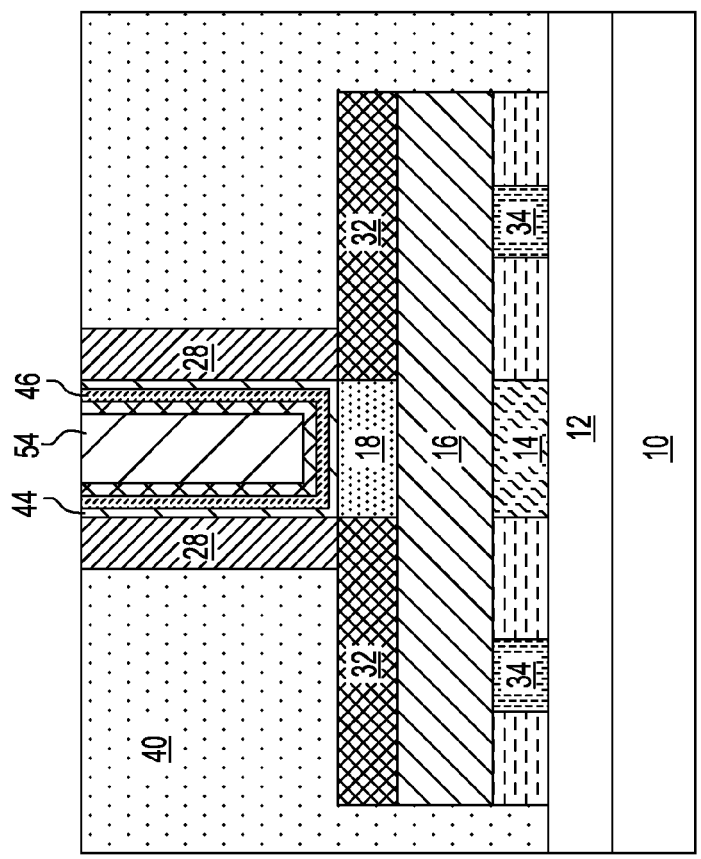
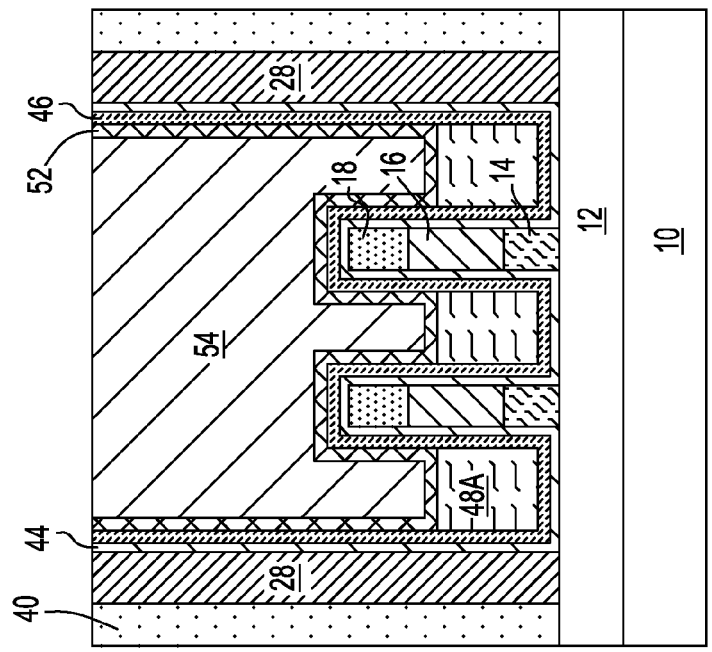
FIG. 11B
FIG. 11C

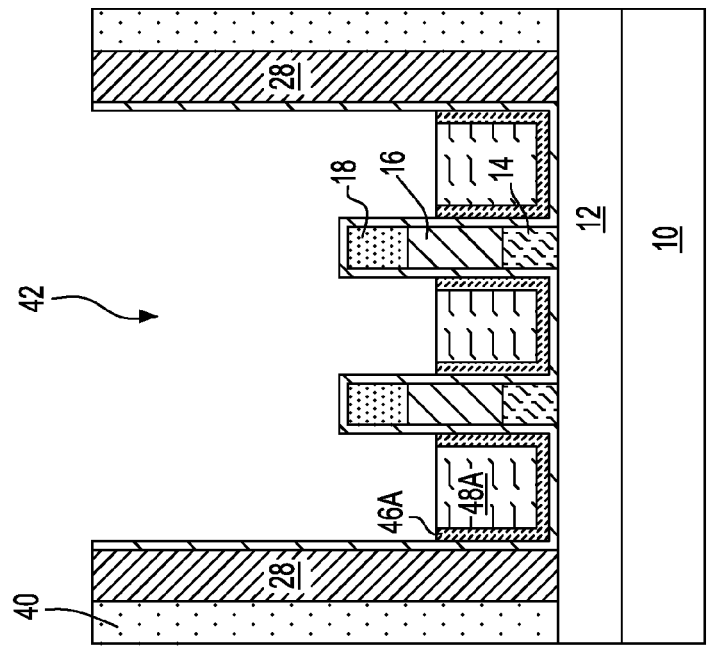
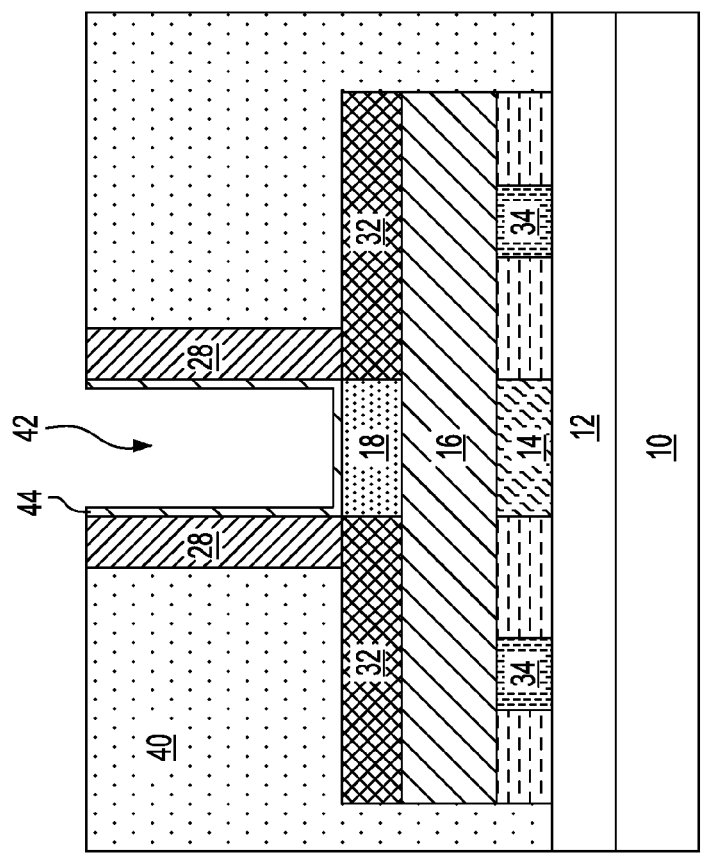
FIG. 13B
FIG. 13C

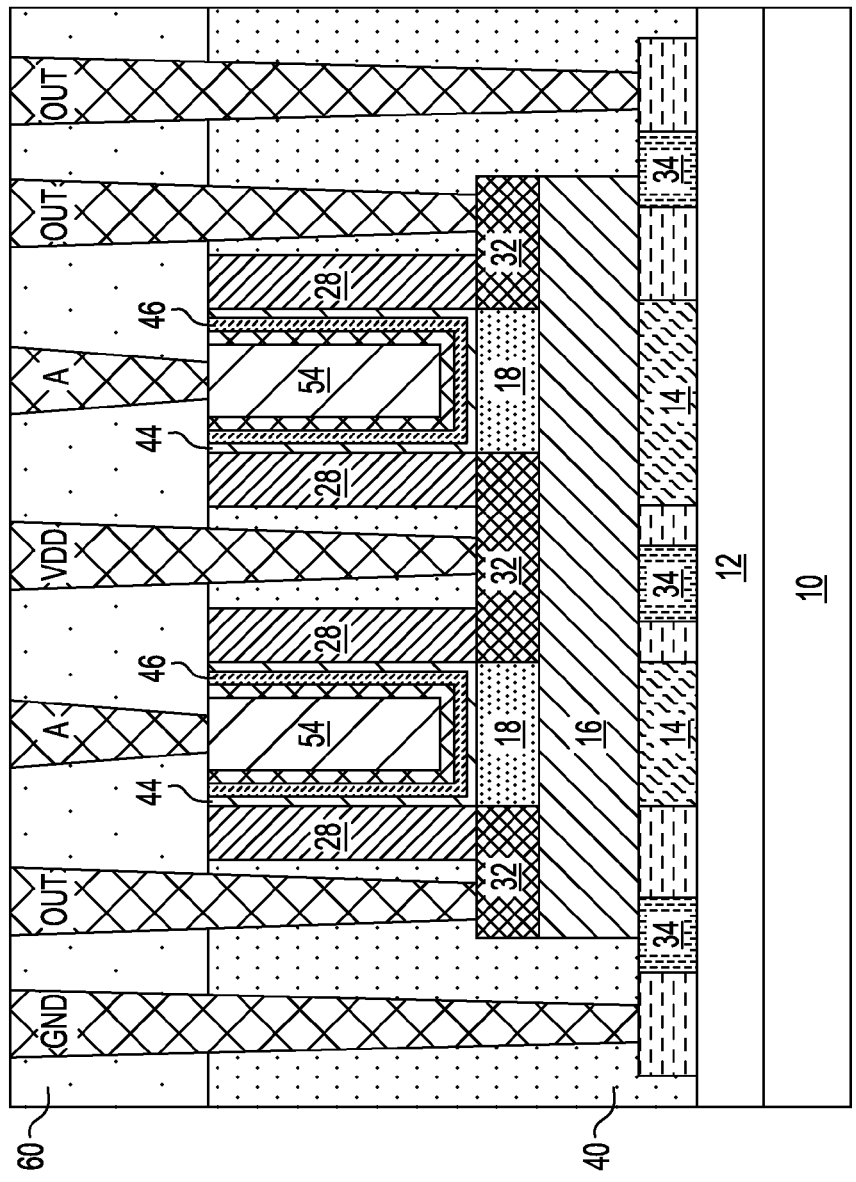
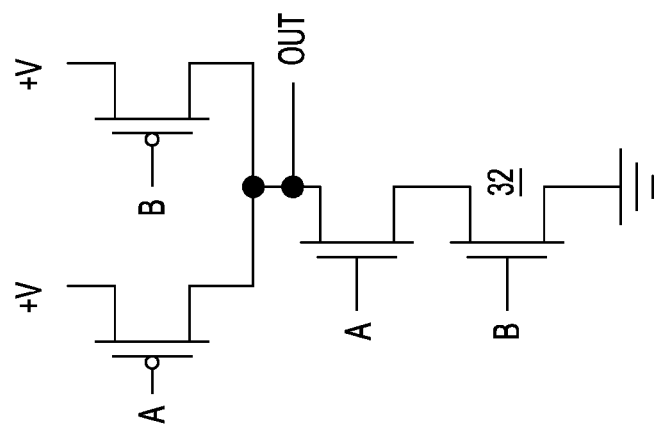
FIG. 15A
FIG. 15B

DUAL WORK FUNCTION INTEGRATION FOR STACKED FINFET

BACKGROUND

The present application relates to the fabrication of semiconductor devices, and more particularly, to the formation of dual work function metal gate structures for a stacked fin complementary metal oxide semiconductor (CMOS) device.

Three-dimensional (3D) monolithic integration in which transistors are stacked on top of each other is a promising approach for continue transistor density scaling. In a 3D stacked fin CMOS device, a self-aligned stack of fins can be formed where the top tier and bottom tier fins are used for devices with opposite conductivity types (i.e., p-type and n-type), respectively. Such an approach not only allows smaller footprint by stacking one type of fin field effect transistors (FinFETs) (e.g., p-type FinFETs) on top of a complementary type of FinFETs (e.g., n-type FinFET), but also permits use of different channel materials for two types of FinFETs simply by bonding appropriate device layers. In a stacked fin CMOS device, the n-type FinFET and the p-type FinFET share a common gate electrode. Because a threshold voltage of a FinFET is primarily determined by the work function of the gate metal used, and in order to obtain a desired threshold voltage for either n-type or p-type FinFET, two meal gate structures having different work functions are typically used. It is challenging, however, to form independently adjustable duel work function metal gate structures in the stacked fin CMOS device due to the difficulty in selective removal of one of the metal gate structures by lithography and etching in vertically stacked devices. Therefore, there remains a need for an improved method for fabricating dual work function metal gate structures for a stacked fin CMOS device that is compatible with existing CMOS process flows.

SUMMARY

The present application provide a three-dimensional stacked fin COMS device having dual work function metal gate structures. The stacked fin CMOS device includes a fin stack having a first semiconductor fin over a substrate, a dielectric fin atop the first semiconductor fin and a second semiconductor fin atop the dielectric fin, and a gate stack straddling the fin stack. The gate stack includes a first metal gate portion surrounding a channel portion of the first semiconductor fin and a second metal gate portion surrounding a channel portion of the second semiconductor fin. The first metal gate portion has a first work function suitable to reduce a threshold voltage of a field effect transistor (FET) of a first conductivity type, while the second gate portion has a second work function suitable to reduce a threshold voltage of a FET of a second conductivity type opposite the first conductivity type. No mask is needed in forming the first and the second metal gate portions.

In one aspect of the present application, a semiconductor structure is provided. In one embodiment, the semiconductor structure includes at least one fin stack located on a substrate. The at least one fin stack includes a first semiconductor fin, a dielectric fin atop the first semiconductor fin, and a second semiconductor fin atop the dielectric fin. The semiconductor structure further includes at least one gate stack straddling a portion of the at least one fin stack. The at least one gate stack includes a gate dielectric contacting a channel portion of the first semiconductor fin, a portion of the dielectric fin and a channel portion of the second semiconductor fin, a first work function metal overlying the gate dielectric, a first gate conductor overlying a lower portion of the first work function metal, a second work function metal overlying a remaining portion of the first work function metal and the first gate conductor, and a second gate conductor overlying the second work function metal. The first gate conductor surrounds the channel portion of the first semiconductor fin. The second work function metal surrounds the channel portion of the second semiconductor fin.

In another embodiment, the semiconductor structure includes at least one fin stack located on a substrate, the at least one fin stack comprising a first semiconductor fin, a dielectric fin atop the first semiconductor fin, and a second semiconductor fin atop the dielectric fin. The semiconductor structure further includes at least one gate stack straddling a portion of the at least one fin stack. The at least one gate stack includes a gate dielectric contacting a channel portion of the first semiconductor fin, a portion of the dielectric fin and a channel portion of the second semiconductor fin, a first work function metal portion overlying a lower portion of the gate dielectric, a first gate conductor overlying the first work function metal portion, a second work function metal overlying a remaining portion of the gate dielectric, the first work function metal portion and the first gate conductor, and a second gate conductor overlying the second work function metal. The first work function metal portion surrounds the channel portion of the first semiconductor fin. The second work function metal surrounds the channel portion of the second semiconductor fin.

In another aspect of the present application, a method of forming a semiconductor structure is provided. The method includes first forming at least one gate cavity laterally surrounded by an interlevel dielectric (ILD) layer. The gate cavity exposes a portion of at least one fin stack including a first semiconductor fin, a dielectric fin atop the first semiconductor fin, and a second semiconductor fin atop the dielectric fin. Next, a stack including a gate dielectric located over sidewalls and a bottom surface of the gate cavity, a first work function metal located over the gate dielectric, and a first gate conductor layer portion located over the first work function metal is formed in the gate cavity. The first gate conductor layer portion fills a remaining volume of the gate cavity. Next, the first gate conductor layer portion is recessed to provide a first gate conductor. A top surface of the first gate conductor is located between a top surface of the dielectric fin and a bottom surface of the dielectric fin. After forming a second work function metal layer on a portion of the first work function metal that is not covered by the first gate conductor and on a top surface of the first gate conductor, a second gate conductor layer is formed on the second work function metal layer to fill the gate cavity.

BRIEF DESCRIPTION OF THE DRAWINGS

FIG. 1A is a top view of a first exemplary semiconductor structure that includes a substrate including a handle substrate, a first dielectric layer, a first semiconductor layer, a second dielectric layer and a second semiconductor layer according to a first embodiment of the present application.

FIG. 4B is a cross-sectional view of the first exemplary semiconductor structure of FIG. 4A along line B-B'.

FIG. 4C is a cross-sectional view of the first exemplary semiconductor structure of FIG. 4A along line C-C'.

FIG. 6B is a cross-sectional view of the first exemplary semiconductor structure of FIG. 6A along line B-B'.

FIG. 6C is a cross-sectional view of the first exemplary semiconductor structure of FIG. 6A along line C-C'.

FIG. 7A is a top view of the first exemplary semiconductor structure of FIGS. 6A-6C after forming a gate dielectric layer over sidewalls and a bottom surface of the gate cavity and a topmost surface of the ILD layer followed by forming a first work function metal layer over the gate dielectric layer.

FIG. 9B is a cross-sectional view of the first exemplary semiconductor structure of FIG. 9A along line B-B'.

FIG. 9C is a cross-sectional view of the first exemplary semiconductor structure of FIG. 9A along line C-C'.

FIG. 11B is a cross-sectional view of the first exemplary semiconductor structure of FIG. 11A along line B-B'.

FIG. 11C is a cross-sectional view of the first exemplary semiconductor structure of FIG. 11A along line C-C'.

FIG. 13B is a cross-sectional view of the first exemplary semiconductor structure of FIG. 13A along line B-B'.

FIG. 13C is a cross-sectional view of the first exemplary semiconductor structure of FIG. 13A along line C-C'.

FIG. 15A illustrates a schematic circuit diagram of a CMOS NAND gate.

FIG. 15B is a cross-sectional view of a NAND circuit of FIG. 15A that can be derived from the first exemplary semiconductor structure of the present application.

DETAILED DESCRIPTION

Figure 1C:
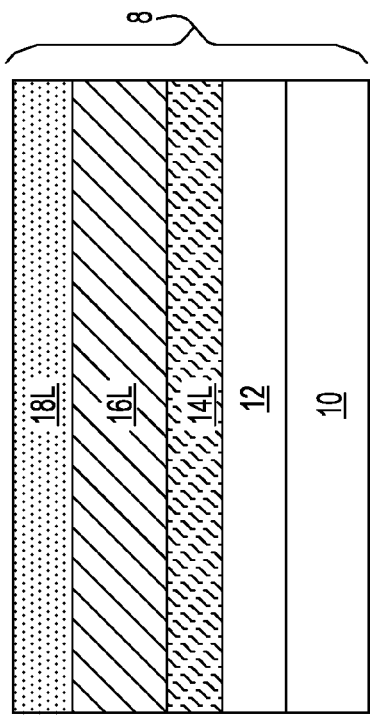
FIG. 1C is a cross-sectional view of the first exemplary semiconductor structure of FIG. 1A along line C-C'.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form dual work function metal gate structures for a stacked fin CMOS device, the basic concept of the present application can also be applied to form dual work function metal gate structures for nanowire FETs.

Figure 1B:
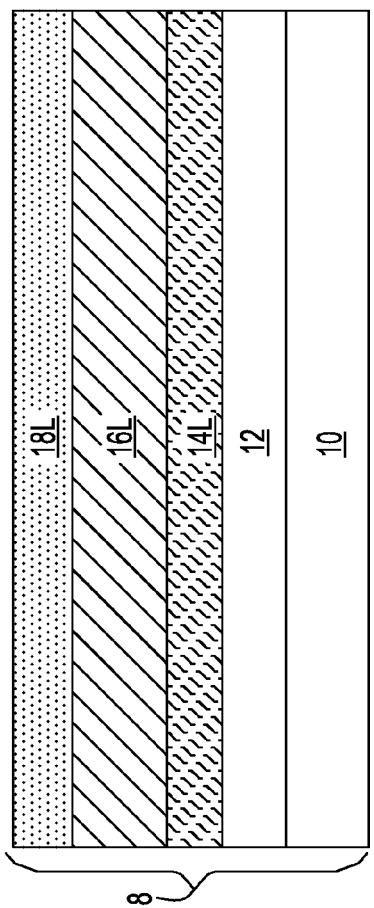
FIG. 1B is a cross-sectional view of the first exemplary semiconductor structure of FIG. 1A along line B-B'.

Referring to FIGS. 1A-1C, a first exemplary semiconductor structure that can be employed according to a first embodiment of the present application includes a substrate 8 including, from bottom to top, a handle substrate 10, a first dielectric layer 12, a first semiconductor layer 14L, a second dielectric layer 16L and a second semiconductor layer 18L. The first semiconductor layer 18L and the second semiconductor layer 14L are used to form semiconductor fins for a stacked fin CMOS device, as described in more detail below. The second dielectric layer 16L serves as an insulator between the first semiconductor layer 14L and the second semiconductor layer 18L, while the first dielectric layer 12L serves as an insulator between the first semiconductor layer 14L and the handle substrate 10.

The handle substrate 10 may include a semiconductor material such as, for example, Si, SiC, SiGe, SiGeC, GaAs, InAs, InP as well as other III/V or II/VI compound semiconductors. The handle substrate 10 provides mechanical support during the handling of the substrate 8. The thickness of the handle substrate 10 can be from 30 μm to about 2 mm, although lesser and greater thicknesses can also be employed.

The first dielectric layer 12 may include a dielectric material such as, for example, silicon oxide, silicon nitride, boron nitride, silicon oxynitride, or a combination thereof. The thickness of the first dielectric layer 12 can be from 50 nm to 300 nm, although lesser and greater thicknesses can also be employed.

The first semiconductor layer 14L may include a semiconducting material such as, for example, Si, SiC, SiGe, SiGeC, GaAs, InAs, InP as well as other III/V or II/VI compound semiconductors. The first semiconductor layer 14L may be composed of a semiconductor material that is the same as, or different from, that of the handle substrate 10. In one embodiment, each of the handle substrate 10 and the first semiconductor layer 14L is composed of a single crystalline semiconductor material, such as, for example, single crystalline silicon. The first semiconductor layer 14L may be doped with p-type dopants or n-type dopants. Examples of p-type dopants for a silicon containing semiconductor material include, but are not limited to, boron, aluminum, gallium and indium. Examples of n-type dopants for a silicon containing semiconductor material, include but are not limited to, antimony, arsenic and phosphorous. The thickness of the first semiconductor layer 14L can be from 10 nm to 150 nm, although lesser and greater thicknesses can also be employed.

The second dielectric layer 16L may include a dielectric material such as, for example, silicon oxide, silicon nitride, boron nitride, silicon oxynitride, or a combination thereof. The second dielectric layer 16L may be comprised of a dielectric material the same as, or different from that of the first dielectric layer 12. In one embodiment, each of the first dielectric layer 12 and the second dielectric layer 16L is composed of silicon oxide. The thickness of the second dielectric layer 16L can be from about 20 nm to about 150 nm, although lesser and greater thicknesses can also be employed.

The second semiconductor layer 18L is comprised of any semiconducting material which may be the same as, or different from, that of the first semiconductor layer 14L. Thus, the second semiconductor layer 18L may include, for example, Si, SiC, SiGe, SiGeC, GaAs, InAs, InP as well as other III/N or II/VI compound semiconductors. In one embodiment and when the first semiconductor layer 14L includes Si which is better suited for n-type FETs, the second semiconductor layer 18L may include SiGe which is better suited for p-type FETs. The second semiconductor layer 18L may be doped with dopants having a conductivity opposite to that of the first semiconductor layer 14L. The thickness of the second semiconductor layer 18L can be from about 5 nm to about 150 nm, although lesser and greater thicknesses can also be employed.

The second semiconductor layer 18L may have a crystallographic orientation which is the same as, or different from, that of the first semiconductor layer 14L. In one embodiment, the second semiconductor layer 18L has a crystal orientation different from that of the first semiconductor layer 14L, which allows for fabricating FinFETs on a crystallographic orientation that provides optimal performance for each type of devices (i.e., p-type FinFETs and n-type FinFETs). For example, n-type FinFETs have an optimal performance when fabricated on a (100) crystallographic surface, while p-type Fin FETs have an optimal performance when fabricated on a (110) crystallographic surface.

The substrate 8 may be formed using process for providing an SOI wafer known in the art. For example, a layer transfer process can be used in which wafer bonding is employed. In the layer transfer process, two semiconductor wafers are bonded together. The two wafers used in fabricating the substrate 8 may include two SOI wafers, wherein one of the wafers includes the handle substrate 10, the first dielectric layer 12 and the first semiconductor layer 14L and the other wafer includes the second dielectric layer 16L and the second semiconductor layer 18L. At least one of the wafer can be subjected to hydrogen implantation to provide a $H_2$ implant region which can be used to split a portion of at least one of the wafers during bonding.

Optionally, a pad layer (not shown) may be deposited on the second semiconductor layer 18L to protect the second semiconductor layer 18L during the subsequent patterning processes. The pad layer may include silicon nitride or a stack of, for bottom to top, a silicon oxide layer and a silicon nitride layer.

Figure 2A:
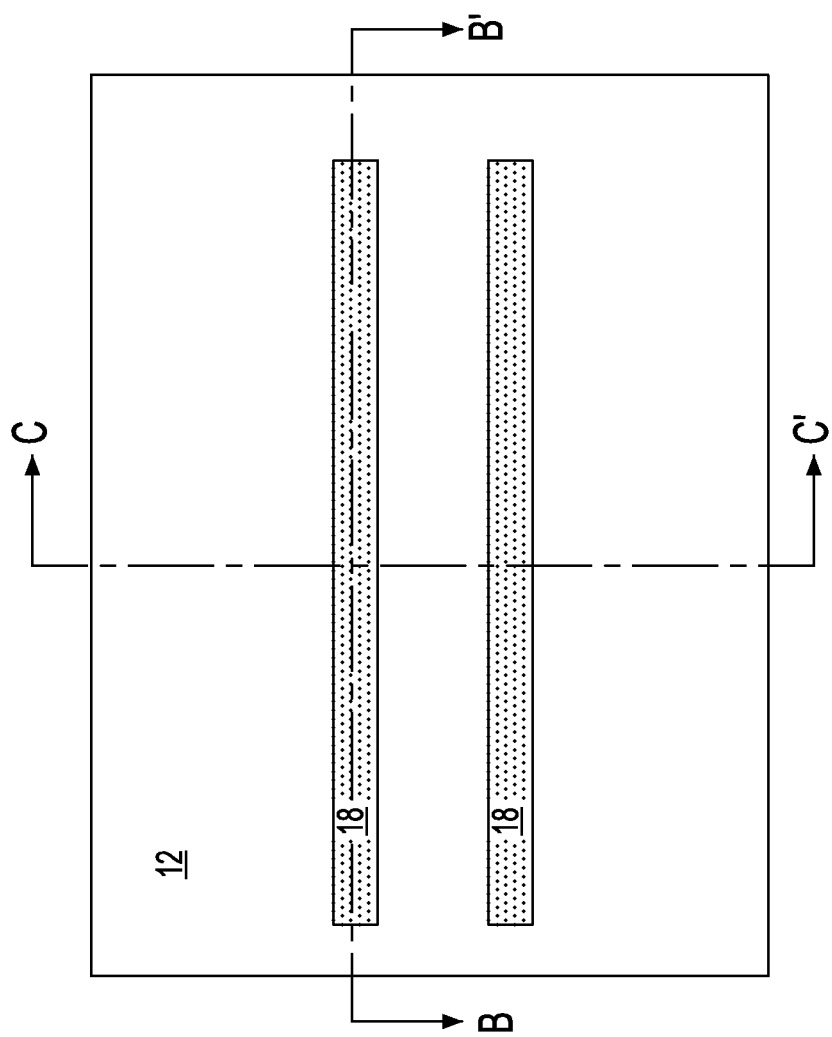
FIG. 2A is a top view of the first exemplary semiconductor structure of FIGS. 1A-1C after forming a plurality of fin stacks on the first dielectric layer, wherein each of the fin stacks includes a first semiconductor fin, a dielectric fin and a second semiconductor fin.
Figure 2C:
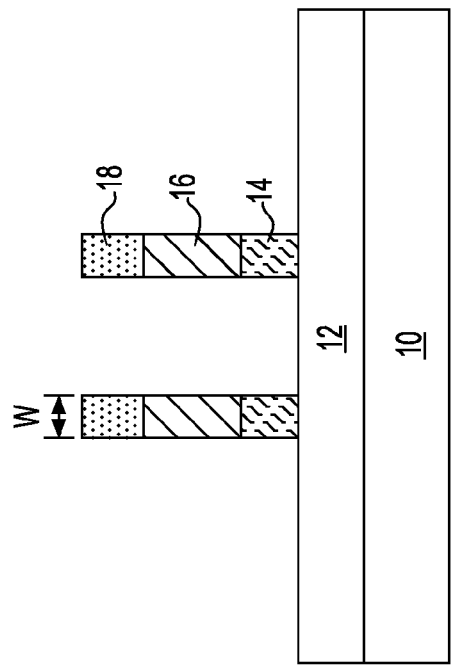
FIG. 2C is a cross-sectional view of the first exemplary semiconductor structure of FIG. 2A along line C-C'.
Figure 2B:
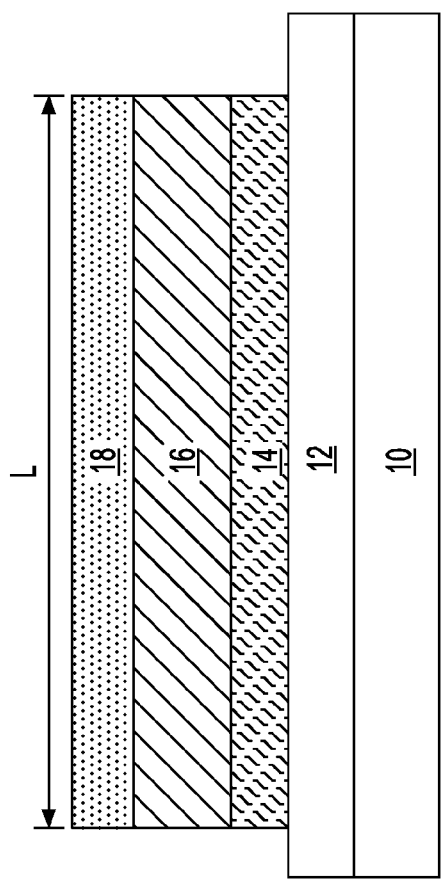
FIG. 2B is a cross-sectional view of the first exemplary semiconductor structure of FIG. 2A along line B-B'.

Referring to FIGS. 2A-2C, a plurality of fin stacks are formed on the first dielectric layer 12. Each of the fin stacks includes, from bottom to top, a first semiconductor fin 14, a dielectric fin 16 and a second semiconductor fin 18. As used herein, a "fin" is a structure that has a first pair of sidewalls along a lengthwise direction that is longer than a second pair of sidewalls along a widthwise direction. For example and as shown in FIGS. 2B-2C, each of the first semiconductor fin 14, the dielectric fin 16 and the second semiconductor fin 18 can have a length L along the lengthwise direction, which is a first horizontal direction that is perpendicular to the surface normal of the top surface of the first dielectric layer 12, and has a width W along the widthwise direction, which is a second horizontal direction that is perpendicular to the surface normal of the top surface of the first dielectric layer 12 and perpendicular to the lengthwise direction. The length L is greater than the width W. In one embodiment, the width W can be from 5 nm to 50 nm, the length L can be from 10 nm to 50 p.m. The fin stacks (14, 16, 18) may have a pitch ranging from 20 nm to 100 nm, with a pitch ranging from 30 nm to 50 nm being more typical.

The fin stacks (14, 16, 18) may be formed by lithography and etching. The lithographic step includes applying a photoresist layer (not shown) atop the second semiconductor layer 18L or the pad layer, if present, exposing the photoresist layer to a desired pattern of radiation, and developing the exposed photoresist layer utilizing a conventional resist developer. The etching process may be a dry etch and/or a wet chemical etch. Illustrative examples of suitable dry etching processes that can be used in the present application include reactive ion etch (RIE), ion beam etching, plasma etching or laser ablation. Typically, a RIE process is used. The etching process transfers the pattern from the patterned photoresist layer to the stack of the second semiconductor layer 18L, the second dielectric 16L and the first semiconductor layer 14L or first to the pad layer, if present, and thereafter to the underlying stack of the second semiconductor layer 18L, the second dielectric layer 16L and the first semiconductor layer 14L utilizing the first dielectric layer 12 as an etch stop. Each remaining portion of the first semiconductor layer 14L constitutes the first semiconductor fin 14, each remaining portion of the second dielectric layer 6L constitutes the dielectric fin 16, and each remaining portion of the first semiconductor layer 18L constitutes the second semiconductor fin 18. After forming the fins stacks (14, 16, 18), the patterned photoresist layer can be removed utilizing a conventional resist stripping process such as, for example, ashing. In some embodiments, a sidewall image transfer process as known in the art may be used in providing the fin stacks (14, 16, 18).

In some embodiments of the present application and when the pad layer is present, the pad layer that remains atop the fin stacks (14, 16, 18) can be removed at this stage. The removal of the remaining non-etched portion of the pad layer may be achieved by performing a selective etching process or by utilizing a planarization process such as chemical mechanical planarization (CMP). In some embodiments, a portion of the pad layer can remain atop each of the fin stacks (14, 16, 18).

Figure 3A:
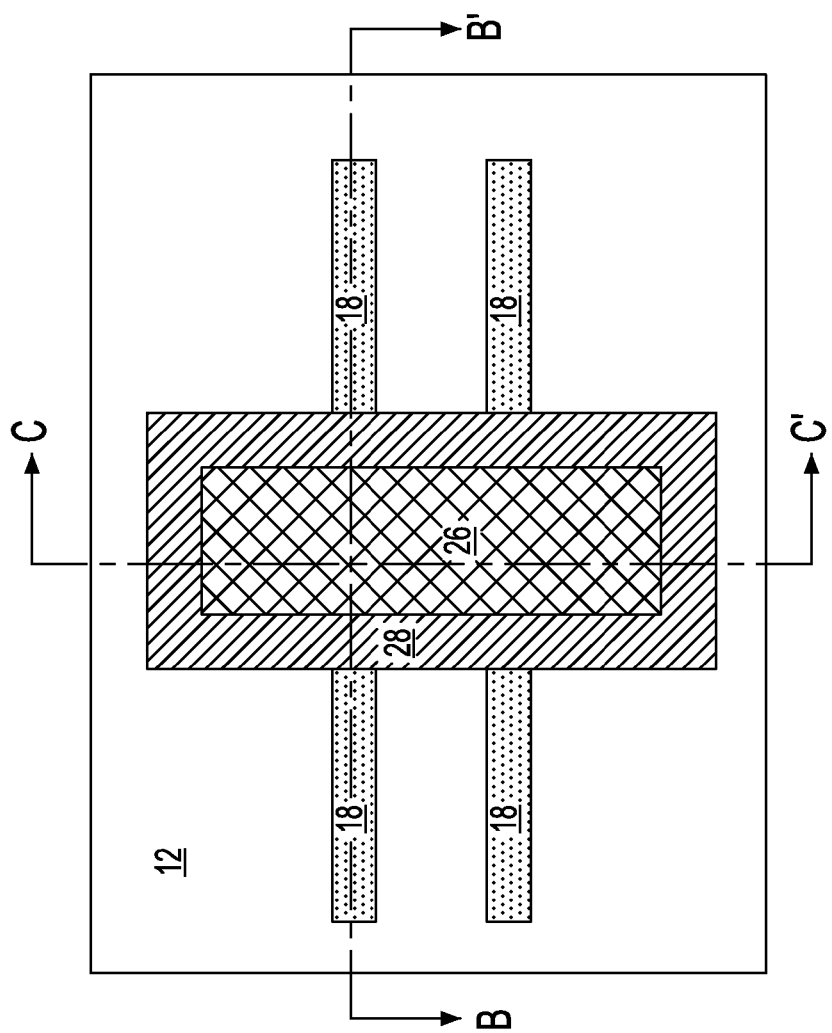
FIG. 3A is a top view of the first exemplary semiconductor structure of FIGS. 2A-2C after forming at least one sacrificial gate structure over each of the fin stacks.
Figure 3C:
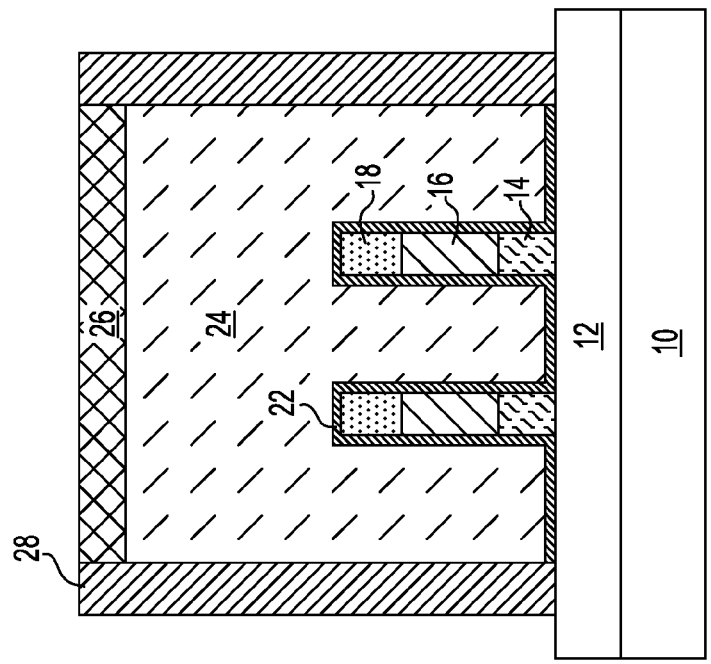
FIG. 3C is a cross-sectional view of the first exemplary semiconductor structure of FIG. 3A along line C-C'.
Figure 3B:
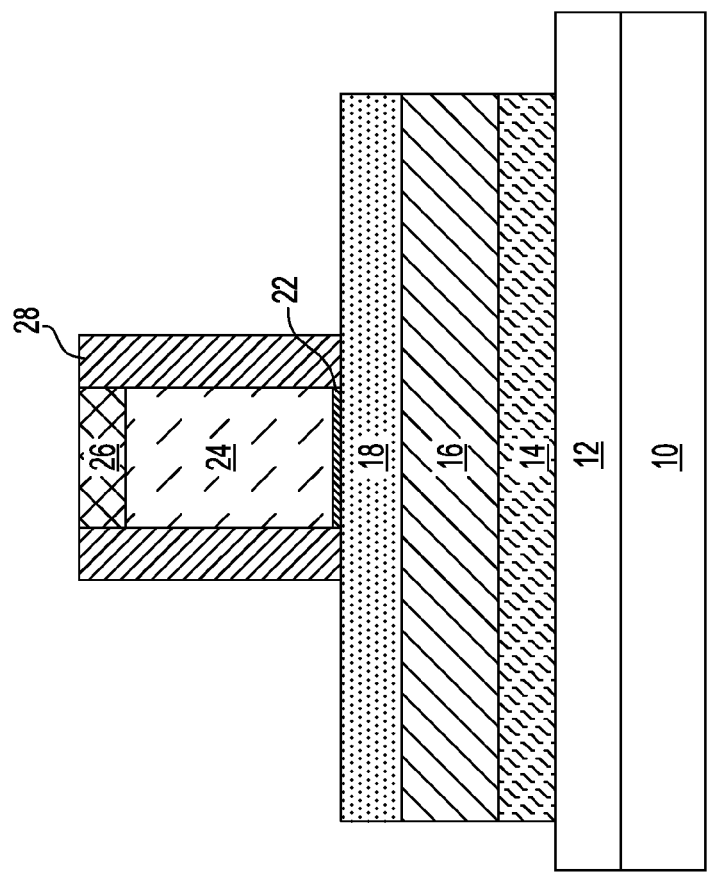
FIG. 3B is a cross-sectional view of the first exemplary semiconductor structure of FIG. 3A along line B-B'.

Referring to FIGS. 3A-3C, at least one sacrificial gate structure is formed over each of the fin stacks (14, 16, 18). The at least one sacrificial gate structure includes a sacrificial gate stack and a gate spacer 28 formed on each sidewall of the sacrificial gate stack. The sacrificial gate stack includes, from bottom to top, a sacrificial gate dielectric 22, a sacrificial gate conductor 24 and a sacrificial gate cap 26. In some embodiments, the sacrificial gate dielectric 22 and/or the sacrificial gat cap 26 may be omitted. The sacrificial gate stack (22, 24, 26) may be formed by first providing a gate material stack (not shown) that includes, from bottom to top, a sacrificial gate dielectric layer, a sacrificial gate conductor layer and a sacrificial gate cap layer over the fins stacks (14, 16, 18) and the first dielectric layer 12. The sacrificial gate dielectric layer may also be formed by conversion of a surface portion of each of the semiconductor fin 14 and the second semiconductor fin 18. In some embodiments of the present application, the sacrificial gate dielectric layer can be omitted. When present, the sacrificial gate dielectric layer includes a dielectric material such as an oxide or a nitride. In one embodiment, the sacrificial gate dielectric layer may include silicon oxide, silicon nitride, or silicon oxynitride. The sacrificial gate dielectric layer that is formed may have a thickness from 1 nm to 10 nm, although lesser and greater thicknesses can also be employed.

The sacrificial gate conductor layer may include a semiconductor material such as polysilicon or a silicon-containing semiconductor alloy such as a silicon-germanium alloy. The sacrificial gate conductor layer may be formed using chemical vapor deposition (CVD) or plasma enhanced chemical vapor deposition (PECVD). The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The material stack can then be patterned by lithography and etching to form the sacrificial gate stack (22. 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. The remaining portions of the material stack after the pattern transfer constitute the sacrificial gate stack (22, 24, 26). The patterned photoresist layer may be subsequently removed by, for example, ashing.

The gate spacer 28 may include a dielectric material such as, for example, an oxide, a nitride, an oxynitride, or any combination thereof. For example, the gate spacer 28 may be composed of silicon nitride, silicon boron carbon nitride, or silicon carbon oxynitride. The gate spacer 28 can be formed by first providing a conformal gate spacer material layer (not shown) on exposed surfaces of the sacrificial gate stacks (22, 24, 26) and the first dielectric layer 12 and then etching the conformal gate spacer material layer to remove horizontal portions of the conformal gate spacer material layer. The conformal gate spacer material layer can be provided by a deposition process including, for example, CVD, PECVD, or physical vapor deposition (PVD). The etching of the conformal gate spacer material layer may be performed by a dry etch process such as, for example, RIE. The remaining portions of the conformal gate spacer material layer constitute the gate spacer(s) 28. The width of each gate spacer 28, as measured at the base of the gate spacer 28 can be from 5 nm to 100 nm, although lesser and greater widths can also be employed.

Figure 4A:
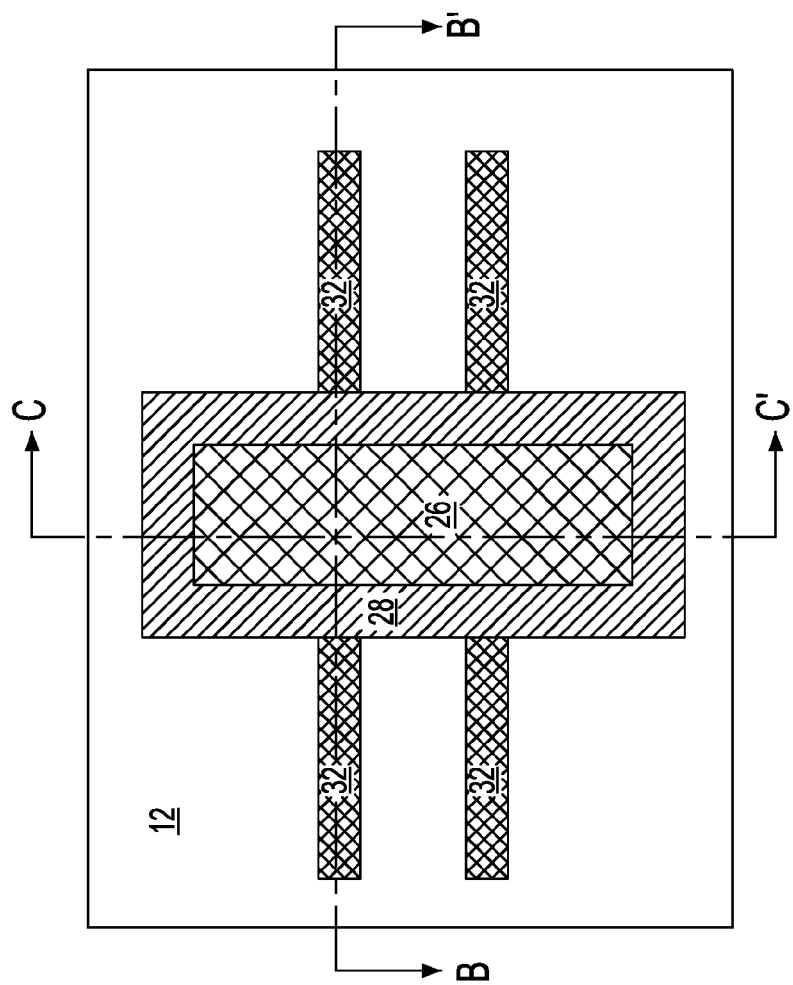
FIG. 4A is a top view of the first exemplary semiconductor structure of FIGS. 3A-3C after forming first source/drain regions in portions of the first semiconductor fins that are not covered by a sacrificial gate stack of the sacrificial gate structure, and second source/drain regions in portions of the second semiconductor fins that are not covered by the sacrificial gate stack of the sacrificial gate structure.

Referring to FIGS. 4A and 4B, a first source region and a first drain region (herein collectively referred to as first source/drain regions 32) are formed in portions of each of the second semiconductor fins 18 that are not covered by the sacrificial gate stack (22, 24, 26), while a second source region and a second drain region (herein collectively referred to as second source/drain regions 34) may be formed in portions of each of the first semiconductor fins 14 that are not covered by the sacrificial gate stack (22, 24, 26). The first and the second source region/drain regions 32, 34 may be formed utilizing ion implantation. In one embodiment where the first semiconductor fin 14 is for an n-type FinFET and the second semiconductor fin 18 is for a p-type FinFET, an n-type ion implantation is performed to dope an n-type dopant such as phosphorous into the second semiconductor fins 18 to provide the first source/drain regions 32, and a p-type ion implantation is performed to dope a p-type dopants such as boron into the first semiconductor fins 14 to provide the second source/drain regions 34. An activation anneal may be subsequently performed to activate the implanted dopants in the first and the second source/drain regions 32, 34.

Figure 5A:
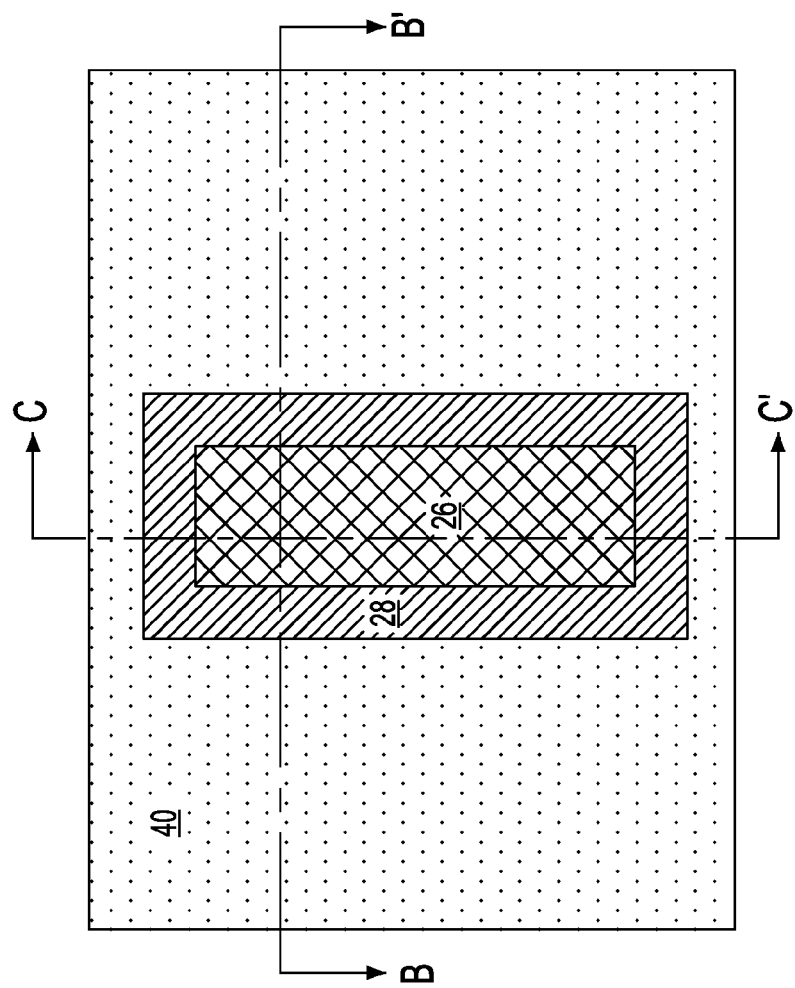
FIG. 5A is a top view of the first exemplary semiconductor structure of FIGS. 4A-4C after forming an interlevel dielectric (ILD) layer over the first dielectric layer and the first and the second source/drain regions to laterally surround the sacrificial gate structure.
Figure 5C:
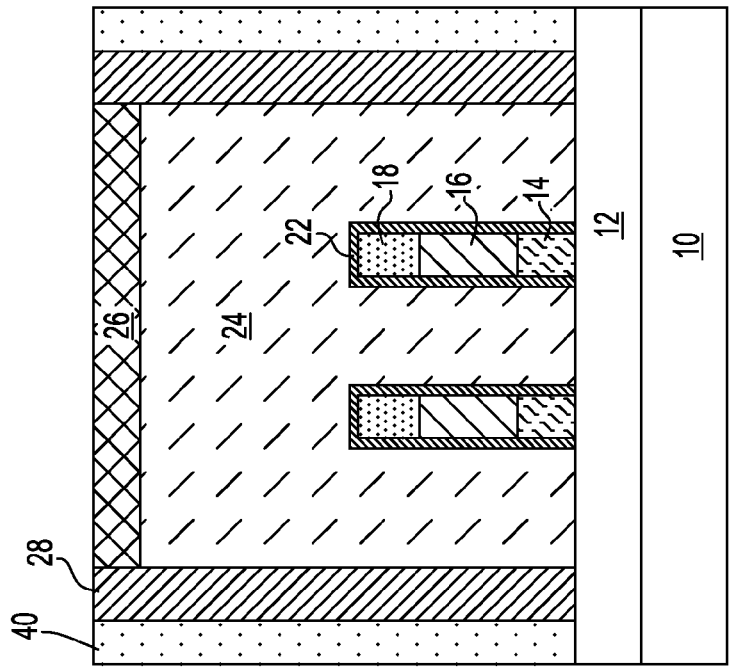
FIG. 5C is a cross-sectional view of the first exemplary semiconductor structure of FIG. 5A along line C-C'.
Figure 5B:
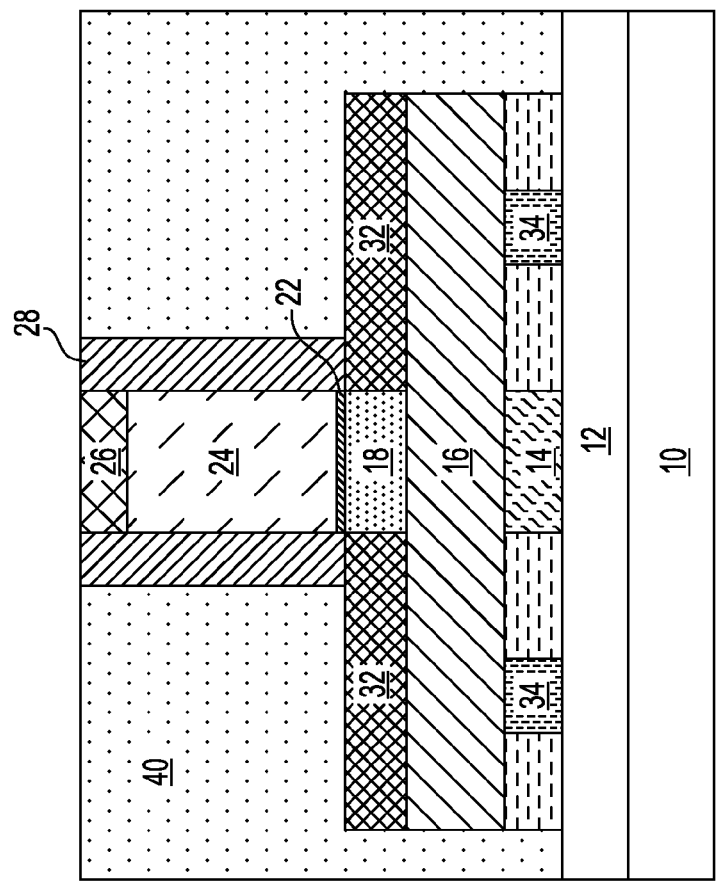
FIG. 5B is a cross-sectional view of the first exemplary semiconductor structure of FIG. 5A along line B-B'.

Referring to FIGS. 5A-5C, an interlevel dielectric (ILD) layer 40 is formed over the first dielectric layer 12 and the first and the second source/drain regions 32, 34 to laterally surround the sacrificial gate structure (22, 24, 26, 28). The ILD layer 40 may include a dielectric material such as undoped silicon oxide, doped silicon oxide, silicon nitride, porous or non-porous organosilicate glass, porous or non-porous nitrogen-doped organosilicate glass, or a combination thereof. The ILD layer 40 may be formed by CVD, PVD or spin coating. The thickness of the ILD layer 40 may be selected so that an entirety of the top surface of the ILD layer 40 is formed above the top surface of the sacrificial gate cap 26. The ILD layer 40 may be subsequently planarized, for example, by CMP and/or a recess etch using the sacrificial gate cap 26 as an etch stop. After the planarization, the ILD layer 40 has a topmost surface coplanar with the top surface of the sacrificial gate cap 26.

Figure 6A:
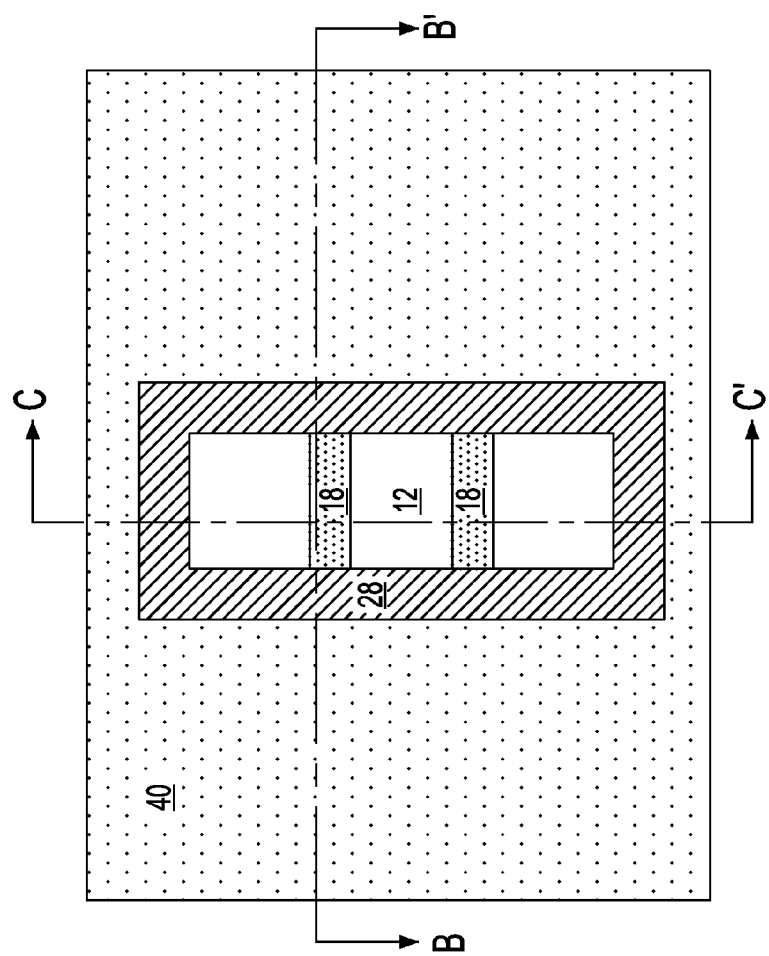
FIG. 6A is a top view of the first exemplary semiconductor structure of FIGS. 5A-5C after removing the sacrificial gate stack to provide a gate cavity.

Referring to FIGS. 6A-6C, the sacrificial gate stack (22, 24, 26) in the sacrificial gate structure (22, 24, 26, 28) is removed to provide a gate cavity 42. The sacrificial gate stack (22, 24, 26) may be removed selectively to the semiconductor materials of the first and the second semiconductor fins 14, 18 and the dielectric materials of the first dielectric layer 12, the dielectric fin 16, the gate spacers 28 and the ILD layer 40 by at least one etch. The at least one etch can be a dry etch and/or a wet chemical etch. The gate cavity 42 thus formed occupies a volume from which the sacrificial gate stack (22, 24, 26) is removed and is laterally confined by inner sidewalls of the gate spacers 28. The gat cavity 42 expose the top surface of the second semiconductor fin 18 and sidewalls of the first semiconductor fin 14, the dielectric fin 16 and the second semiconductor fin 18.

Figure 7C:
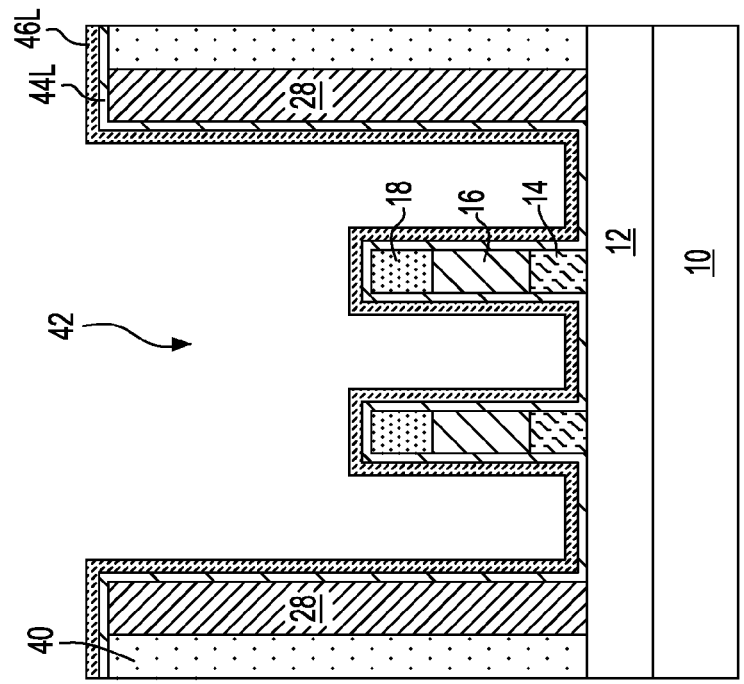
FIG. 7C is a cross-sectional view of the first exemplary semiconductor structure of FIG. 7A along line C-C'.
Figure 7B:
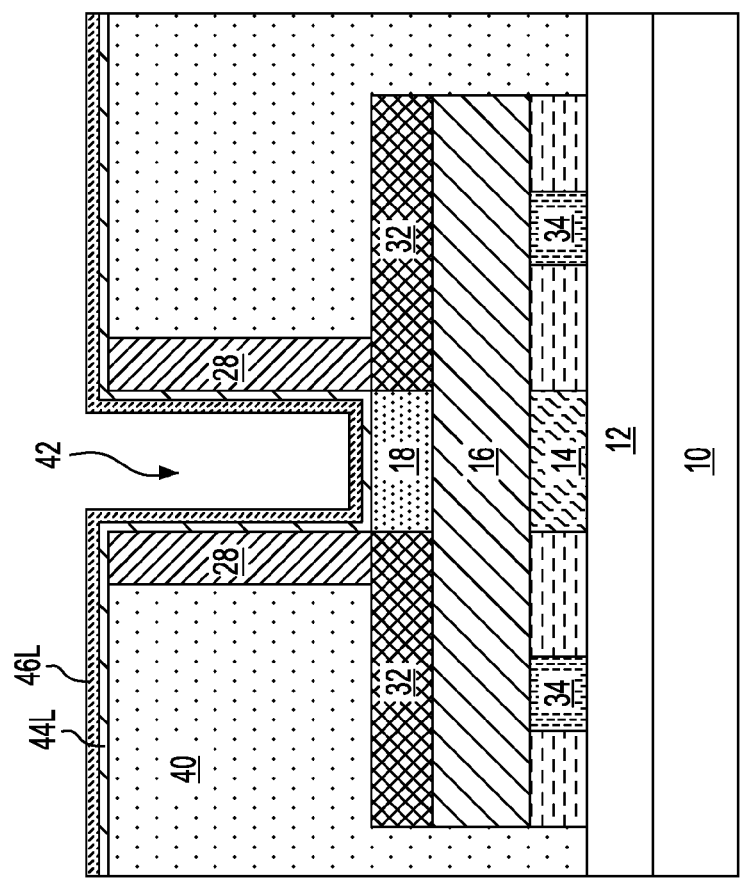
FIG. 7B is a cross-sectional view of the first exemplary semiconductor structure of FIG. 7A along line B-B'.

Referring to FIGS. 7A-7C, a gate dielectric layer 44L is formed over sidewalls and a bottom surface of the gate cavity 42 and the topmost surface of the ILD layer 40. The gate dielectric layer 44L may be formed by conformally depositing a dielectric material by CVD or atomic layer deposition (ALD) over the sidewalls and the bottom surface of the gate cavity 42 and the topmost surface of the ILD layer 40. In one embodiment, the gate dielectric layer 44L is composed of a high-k material having a dielectric constant greater than silicon oxide. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The gate dielectric layer 44L may have a thickness from 0.9 nm to 10 nm, with a thickness ranging from 1.0 nm to 3 nm being more typical.

Subsequently, a first work function metal layer 46L is conformally deposited over the gate dielectric layer 44L. In one embodiment and when the first semiconductor fins 14 are provided for n-type FinFETs, the first work function metal layer 46 may include a first metal that effectuates an n-type threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. The first work function metal layer 46L may include TiAlC, TaAlC, TiAl, Ti, or Al. The work function of the first work function metal layer 46L may range from 4.1 eV to 4.3 eV. The first work function metal layer 46L may be formed by a suitable deposition process such as, for example, CVD, PVD or ALD. The first work function metal layer 46L that is formed may have a thickness ranging from 1 nm to 10 nm, although lesser and greater thicknesses can also be employed.

Figure 8A:
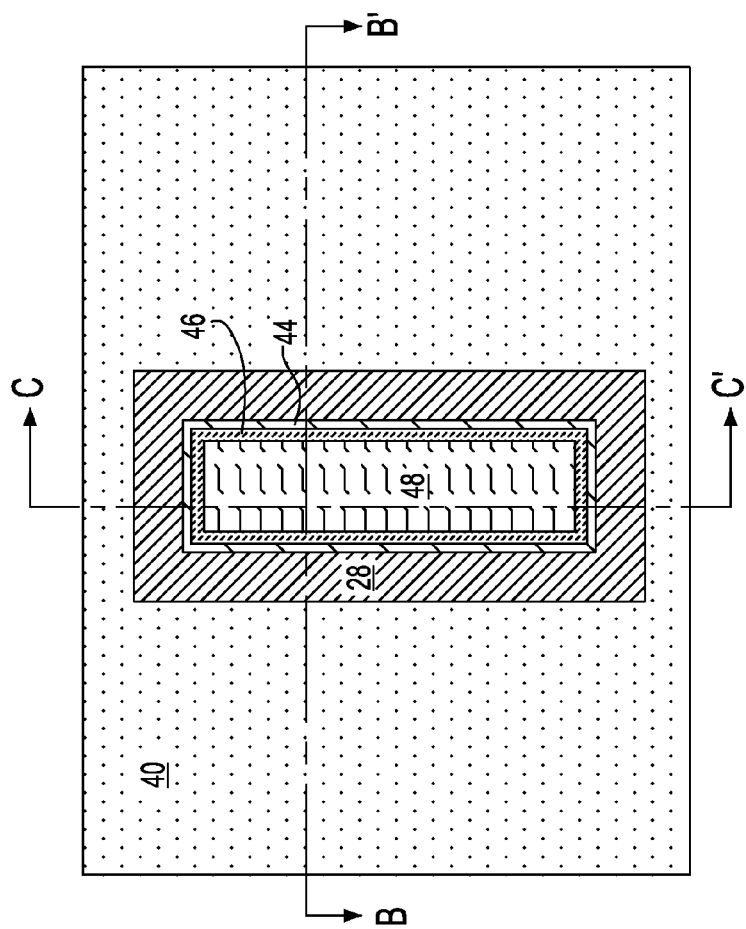
FIG. 8A is a top view of the first exemplary semiconductor structure of FIGS. 7A-7C after forming a stack of a gate dielectric, a first work function metal and a first gate conductor layer portion in the gate cavity.
Figure 8C:
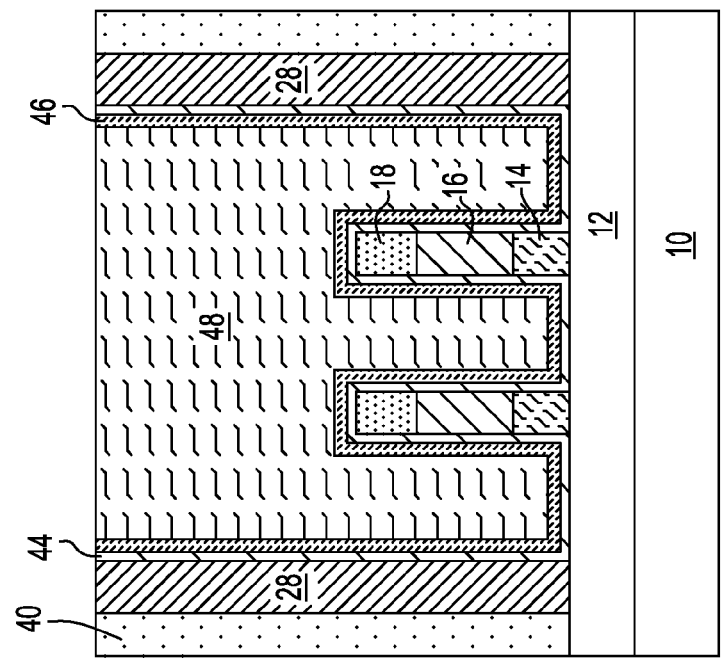
FIG. 8C is a cross-sectional view of the first exemplary semiconductor structure of FIG. 8A along line C-C'.
Figure 8B:
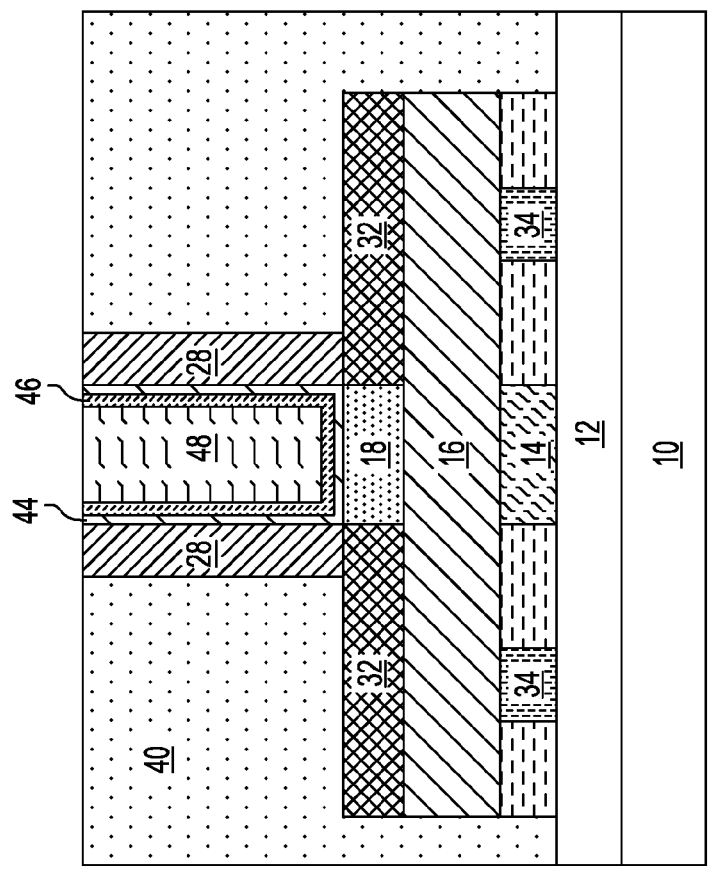
FIG. 8B is a cross-sectional view of the first exemplary semiconductor structure of FIG. 8A along line B-B'.

Referring to FIGS. 8A-8C, a first gate conductor layer (not shown) is formed over the first work function metal layer 46L to fill a remaining volume of the gate cavity 42. The first gate conductor layer may include any conductive material including, for example, doped polysilicon, Al, Au, Ag, Cu or W. The gate conductor layer may be formed by a conventional deposition process such as, for example, CVD, PVD or ALD.

Portions of the gate conductor layer, the first work function metal layer 46L and the gate dielectric layer 44L that are located above the topmost surface of the ILD layer 40 are removed by employing a planarization process, such as, for example, CMP. A remaining portion of the gate dielectric layer on the sidewalls and the bottom surface of the gate cavity 42 constitutes a gate dielectric 44. A remaining portion of the first work function metal layer 46L overlying the gate dielectric 44 constitutes a first work function metal 46. A remaining portion of the first gate conductor layer in the gate cavity 42 constitutes a first gate conductor layer portion 48. Topmost surfaces of the gate dielectric 44, the first work function metal 46 and the first gate conductor layer portion 48 are coplanar with the topmost surface of the ILD layer 40.

Figure 9A:
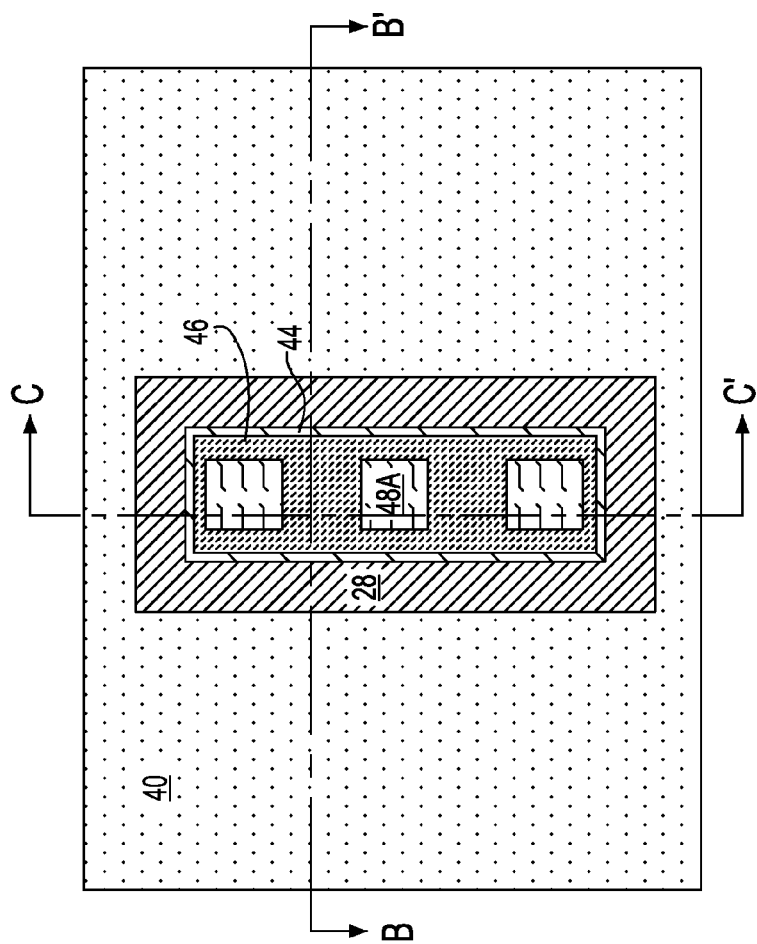
FIG. 9A is a top view of the first exemplary semiconductor structure of FIGS. 8A-8C after recessing the first gate conductor layer portion to form a first gate conductor in a lower portion of the gate cavity.

Referring to FIGS. 9A-9C, the first gate conductor layer portion 48 is recessed to form a first gate conductor 48 in the lower portion of the gate cavity 42. The top surface of the first gate conductor 48A is located between a top surface of the dielectric fin 16 and a bottom surface of the dielectric fin 16. The first gate conductor 48A thus extends over the first semiconductor fin 14 and partially over the dielectric fin 16, but does not extend over the second semiconductor fin 18. An etch back process which can be a dry etch such as, for example RIE may be performed to recess the first gate conductor layer portion 48. The recess of the first gate conductor layer portion 48 exposes a portion of the first function metal 46 that surrounds the second semiconductor fin 18 and an upper portion of the dielectric fin 16 in the gate cavity 42. The first gate conductor 48A and a portion of the first work function metal 46 underlying the first gate conductor 48A collectively constitute a first metal gate portion. The first metal gate portion wraps around a channel portion of the first semiconductor fin 14 in each fin stack (14, 16, 18), thus determining the work function of each first FinFET that is formed.

Figure 10A:
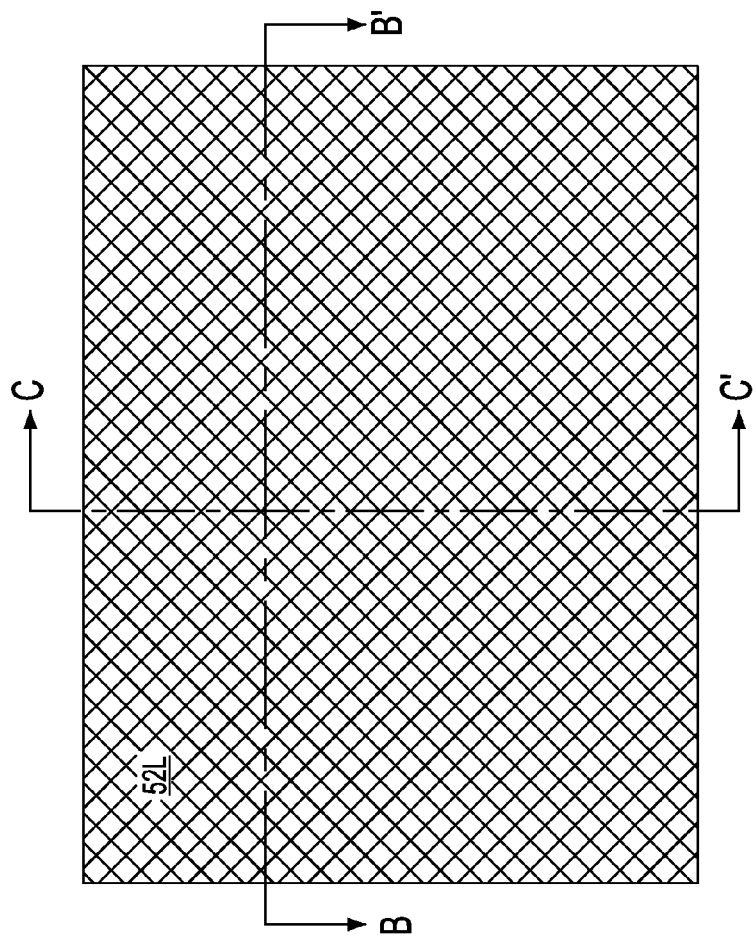
FIG. 10A is a top view of the first exemplary semiconductor structure of FIGS. 9A-9C after forming a second work function metal layer over the first work function metal and the first gate conductor.
Figure 10C:
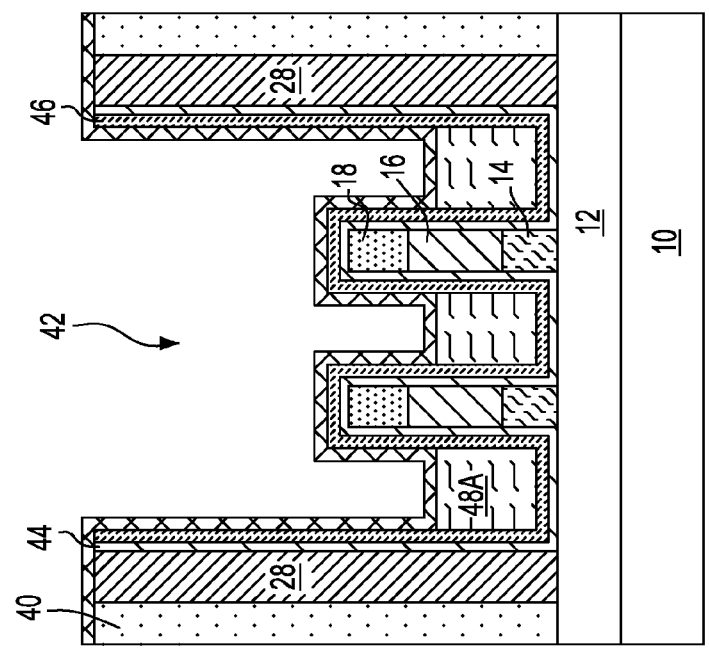
FIG. 10C is a cross-sectional view of the first exemplary semiconductor structure of FIG. 10A along line C-C'.
Figure 10B:
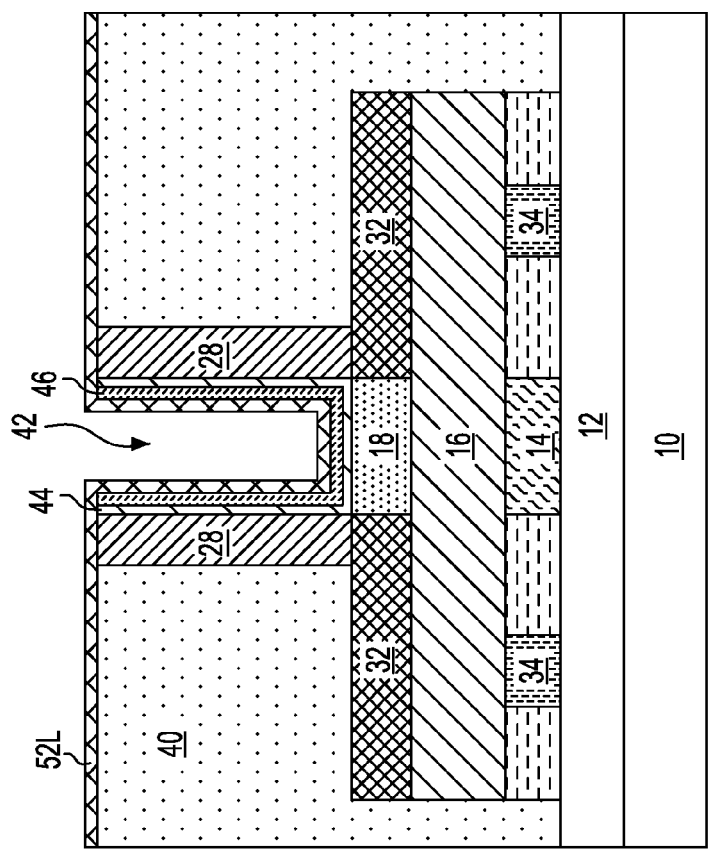
FIG. 10B is a cross-sectional view of the first exemplary semiconductor structure of FIG. 10A along line B-B'.

Referring to FIGS. 10A-10C, a second work function metal layer 52L is conformally deposited over the first work function metal 46, the top surface of the first gate conductor 48A and the topmost surface of the ILD layer 40. The second work function metal layer 52L thus surrounds an entire second semiconductor fin 18 and an upper portion of the dielectric fin 16, but not the first semiconductor fin 14. In one embodiment and when the second semiconductor fins 18 are provided for p-type FinFETs, the second work function metal layer 52L may include a second metal that effectuates a p-type threshold voltage shift. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. The work function of the second work functional metal layer 52L may range from 4.5 eV to 5.2 eV. In one embodiment, the second work function metal layer 52L may include a metal nitride such as, for example, TiN, TaN, NbN, VN, or WN. The second work function metal layer 52L may be formed by a suitable deposition process such as, for example, CVD, PVD or ALD. The second work function metal layer 52L that is formed may have a thickness ranging from 1 nm to 10 nm, although lesser and greater thicknesses can also be employed.

Figure 11A:
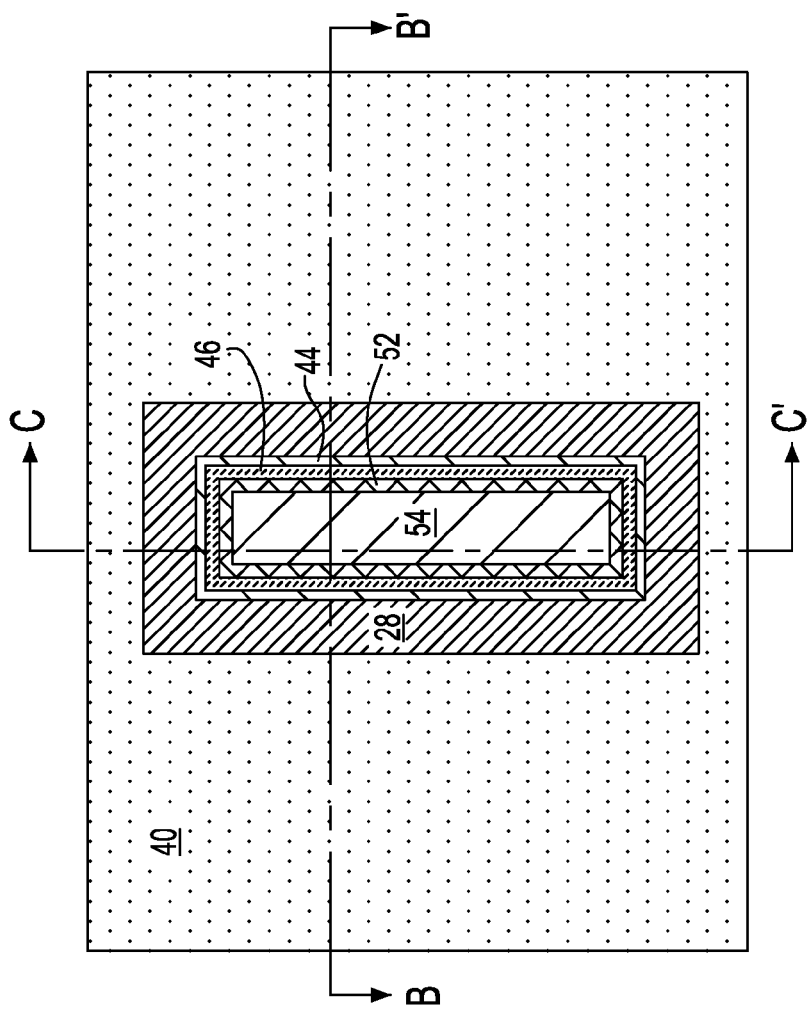
FIG. 11A is a top view of the first exemplary semiconductor structure of FIGS. 10A-10C after forming a second gate conductor over a second work function metal to fill the gate cavity.

Referring to FIGS. 11A-11C, a second gate conductor 54 is deposited by CVD or PVD to fill the gate cavity 42. The second gate conductor 54 may include a conductive material the same as, or different from, the conductive material of the first gate conductor 48A. In one embodiment, each of the first gate conductor and the second gate conductor 48A includes W. The second gate conductor 54 may be formed by first depositing a second gate conductor layer (not shown) over the second work functional metal layer 52L and removing portion of the second gate conductor layer and the second work function metal layer 52L that are located above the topmost surface of the ILD layer 40 to provide the second gate conductor which is a remaining portion of the second gate conductor layer and a second work function metal 52 which is a remaining portion of the second work function metal layer 52L. The second gate conductor 54, the second work function metal 52 and the portion of the first work function metal 46 underlying the second work function metal 52 collectively constitute a second metal gate portion. The second metal gate portion wraps around a channel portion of the second semiconductor fin 18 in each fin stack (14, 16, 18), thus defining the work function of each second FinFET that is formed.

Stacked FinFET CMOS devices each having a second FinFET stacked on top of a complementary first FinFET are thus formed. The first and the second FinFETs share a same gate stack including a gate dielectric, a first metal gate portion having a first work function optimized for the first FinFET and a second metal gate portion having a second work function optimized for the second FinFET. The mask is not needed when forming the first metal gate portion and the second metal gate portion having different work functions.

Figure 12A:
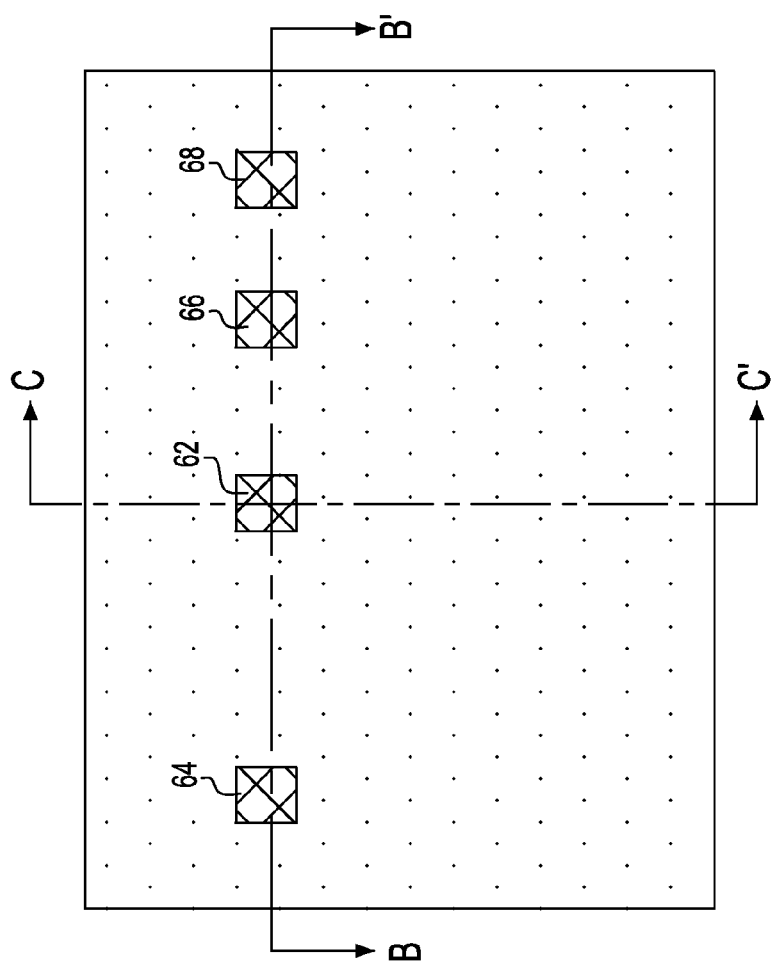
FIG. 12A is a top view of the first exemplary semiconductor structure of FIGS. 11A-11C after forming various contact structures.
Figure 12C:
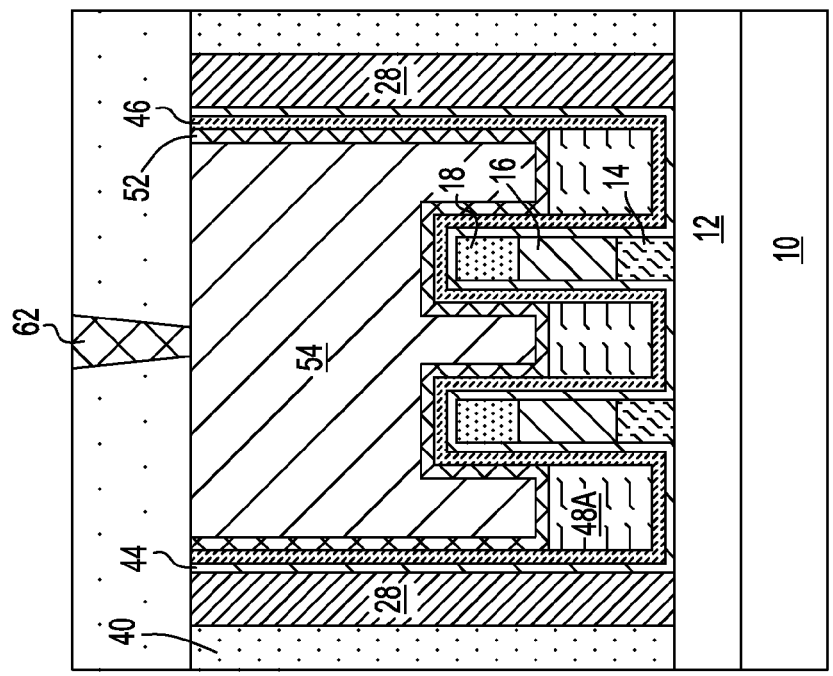
FIG. 12C is a cross-sectional view of the first exemplary semiconductor structure of FIG. 12A along line C-C'.
Figure 12B:
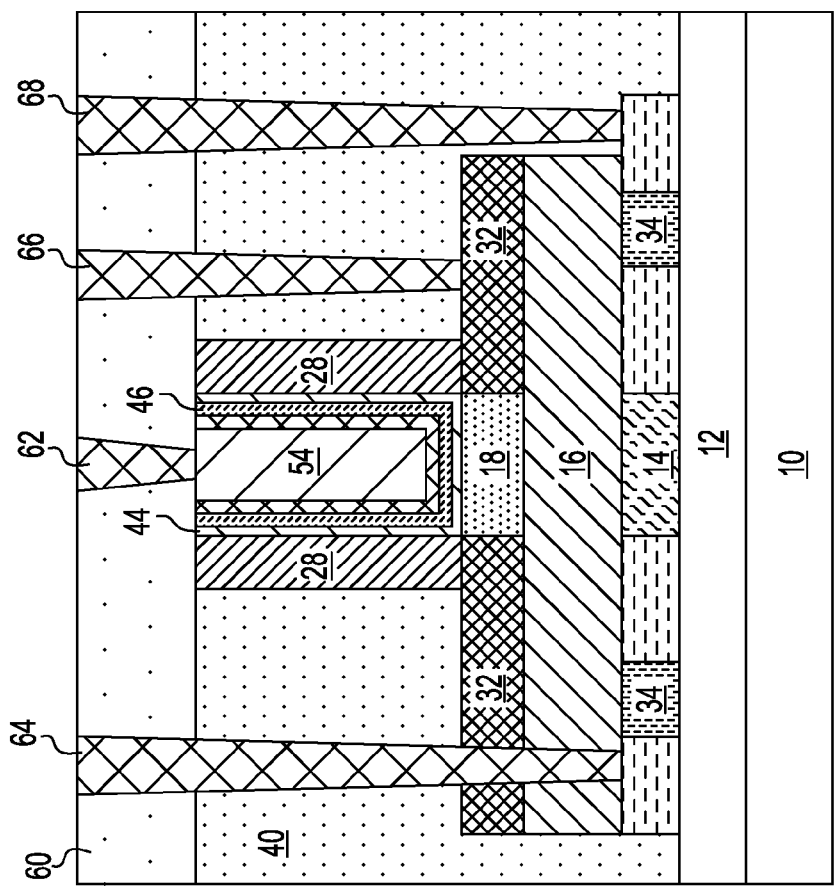
FIG. 12B is a cross-sectional view of the first exemplary semiconductor structure of FIG. 12A along line B-B'.

Referring to FIGS. 12A and 12B, various contact structures are formed. The contact structures include a gate contact structures 62 contacting the second metal gate portion (46, 52, 54), a first source/drain contact structure 64 connecting one of the first source/drain regions 32 (e.g., a first source region) to one of the second source/drain region 34 (e.g., a second drain region), a second source/drain contact structure 66 contacting another of the first source/drain regions 32 and a third source/drain contact structure 68 contacting another of the second source/drain regions 34.

The contact structures (62, 64, 66, 68) may be formed by first depositing a contact level dielectric layer 60 over the ILD layer 40, the metal gate structure (44, 46, 52, 54) and the gate spacer 28. The contact level dielectric layer 60 may include a dielectric material such as, for example, silicon oxide, silicon nitride, organosilicate glass, or a combination thereof. In some embodiments, the contact level dielectric layer 60 may include a dielectric material the same as the dielectric material of the ILD layer 40. The contact level dielectric layer 60 may be formed by CVD, PVD or spin coating. If the contact level dielectric layer 60 is not self-planarizing, the top surface of the contact level dielectric layer 60 may be planarized, for example, by CMP.

Contact openings (not shown) are formed by a combination of lithographic patterning and anisotropic etch. The contact openings include a first contact opening extending through the contact level dielectric layer 60 to expose the second metal gate portion, a second contact opening extending through the contact level dielectric layer 60, the ILD layer 40, one of the first source/drain regions 32 and the dielectric fin 16 to expose one of the second source/drain region 34, a third contact opening extending through the contact level dielectric layer 60 and the ILD layer 40 to expose another of the first source/drain regions 32, and a fourth contact opening extending through the contact level dielectric layer 60 and the ILD layer 40 to expose another of the second source/drain regions 34.

A contact material layer (not shown) is deposited in the contact openings to completely fill the contact openings. The contact material layer may include a metal such as, for example, W, Al, Cu or their alloys. The contact material layer can be formed by any suitable deposition method such as, for example, CVD, PVD or plating.

A portions of the contact material layer that is located above the topmost surface of the contact level dielectric layer 60 may be subsequently removed by employing a planarization process, such as, for example, CMP to provide the contact structures 62, 64, 66, 68.

Figure 13A:
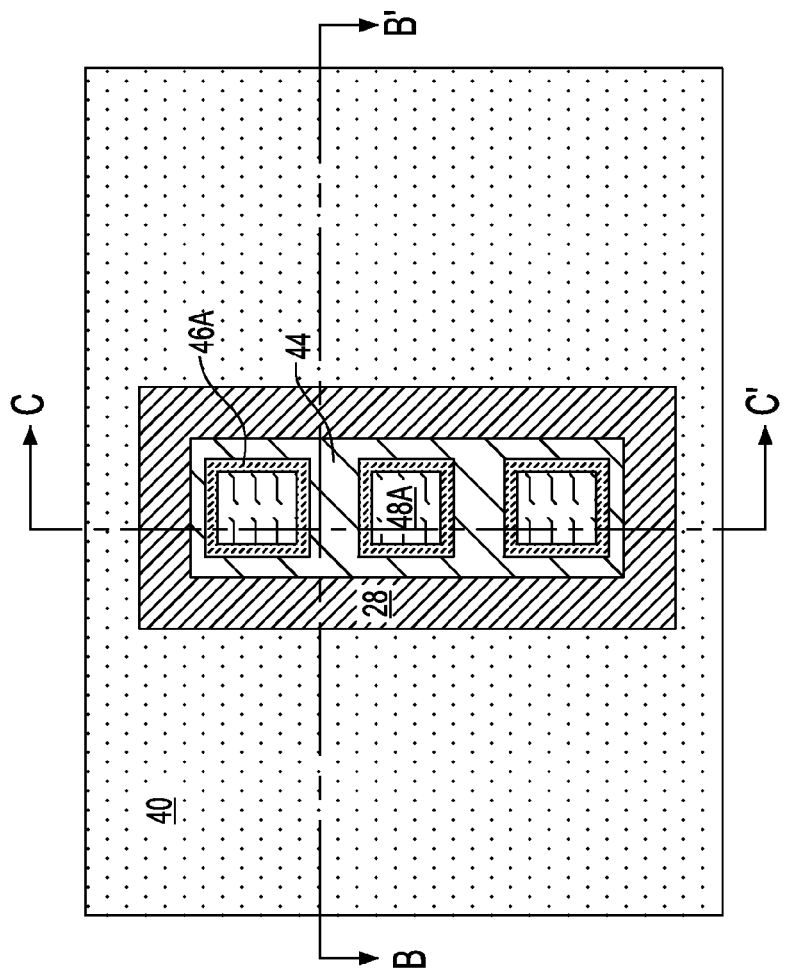
FIG. 13A is a top view of a second exemplary semiconductor structure that can be derived from the first exemplary semiconductor structure of FIGS. 9A-9C after removing a portion of the first work function metal that is not covered by the first gate conductor to provide a first work function metal portion according to a second embodiment of the present application.

Referring to FIGS. 13A-13C, a second exemplary semiconductor structure according to a second embodiment of the present application is derived from the first exemplary semiconductor structure of FIGS. 9A-9C after removing the portion of the first work function metal 46 that is not covered by the first gate conductor 48A in the gate cavity 42. The exposed portion of the first work function metal 46 may be removed selective to the first gate conductor 48A and the gate dielectric 44 by an etch which can be a wet chemical etch or a dry etch. The remaining portion of the first work function metal 46 is herein referred to as a first work function metal portion 46A. The removal of the exposed portion of the first work function metal 46 re-exposes a portion of the gate dielectric 44 in the gate cavity 42.

Figure 14A:
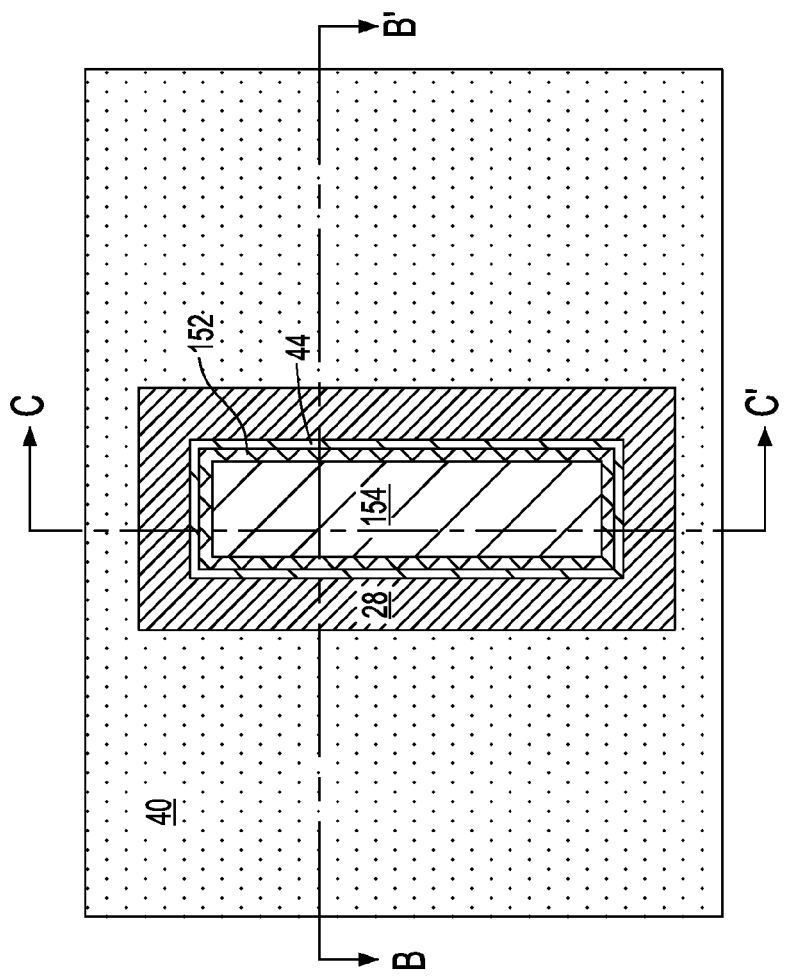
FIG. 14A is a top view of the second exemplary semiconductor structure of FIGS. 13A-13C after forming a second work function metal over the exposed portion of the gate dielectric, the first work function metal portion and the first gate conductor followed by forming a second gate conductor over the second work function metal.
Figure 14C:
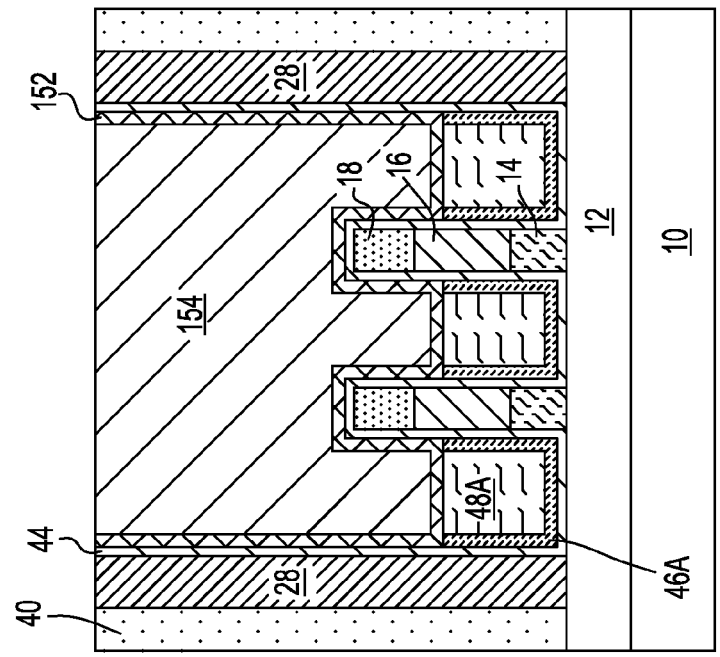
FIG. 14C is a cross-sectional view of the first exemplary semiconductor structure of FIG. 14A along line C-C'.
Figure 14B:
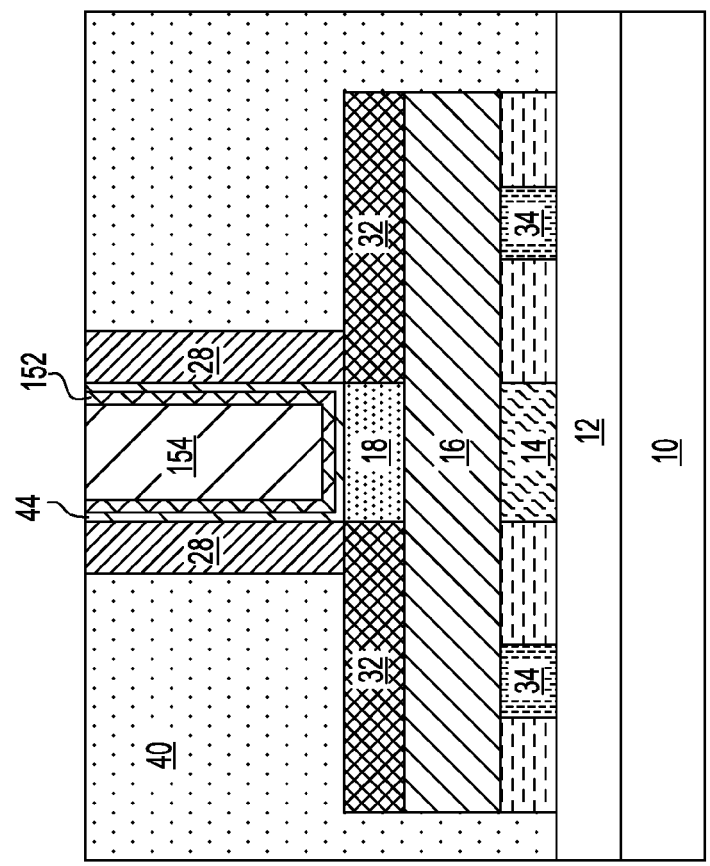
FIG. 14B is a cross-sectional view of the first exemplary semiconductor structure of FIG. 14A along line B-B'.

Referring to FIGS. 14A-14C, a second work function metal 152 is formed on the exposed portion of the gate dielectric 44, the first work function metal portion 46A and the first gate conductor 48A by performing processing steps of FIGS. 10A-10C followed by forming a second gate conductor 154 over the second work function metal 152 by performing processing steps of FIGS. 10A-10C. In the second embodiment of the present application, the first work function metal portion 46A and the first gate conductor 48A collectively constitute the first metal gate portion, while the second work function metal 152 and the second gate conductor 154 collectively constitute the second metal gate portion. The first metal gate portion wraps around a channel portion of the first semiconductor fin 14 in each fin stack (14, 16). The second metal gate portion wraps around a channel portion of the second semiconductor fin 18 in each fin stack (14, 16, 18).

FIGS. 15-15B illustrates one application of the stacked fin CMOS device of the present application. FIG. 15A is a schematic circuit diagram of a CMOS NAND gate illustrating the ground (GND), input voltages (A, B), supply voltage (VDD), output voltages (OUT). FIG. 15B is a cross-sectional view of a NAND circuit that can be derived from the first exemplary semiconductor structure of the present application. The stacked first FinFETs and second FinFETs are connected in a NAND configuration as shown in FIG. 15A.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
at least one fin stack located on a substrate, the at least one fin stack comprising a first semiconductor fin, a dielectric fin atop the first semiconductor fin, and a second semiconductor fin atop the dielectric fin; and
at least one gate stack straddling a portion of the at least one fin stack, the at least one gate stack comprising:
a gate dielectric, the gate dielectric contacting a channel portion of the first semiconductor fin, a portion of the dielectric fin, and a channel portion of the second semiconductor fin;
a first work function metal overlying the gate dielectric;

a first gate conductor overlying a lower portion of the first work function metal, the first gate conductor surrounding the channel portion of the first semiconductor fin;

a second work function metal overlying a remaining portion of the first work function metal and the first gate conductor, the second work function metal surrounding the channel portion of the second semiconductor fin; and a second gate conductor overlying the second work function metal.

2. The semiconductor structure of claim 1, wherein the first gate conductor and the lower portion of the first work function metal surround a lower portion of the portion of the dielectric fin, and the remaining portion of the first work function metal, the second work function metal and the second gate conductor surrounds a remaining portion of the portion of the dielectric fin.

3. The semiconductor structure of claim 2, wherein the first work function metal has a first work function, and the second work function metal has a second work function different from the first work function.

4. The semiconductor structure of claim 3, wherein one of the first work function metal and the second work function metal comprises TiAlC, TaAlC, TiAl, Ti, or Al, and another of the first work function metal and the second work function metal comprises TiN, TaN, NbN, VN, or WN.

5. The semiconductor structure of claim 4, wherein one of the first work function and the second work function ranges from 4.1 eV to 4.3 eV, and another of the first work function and the second work function ranges from 4.5 eV to 5.2 eV.

6. The semiconductor structure of claim 1, wherein the first gate conductor has a top surface located between a top surface of the dielectric fin and a bottom surface of the dielectric fin.

7. The semiconductor structure of claim 1, further comprising first source/drain regions in portions of the first semiconductor fin on opposite sides of the gate stack, and second source/drain regions in portions of the second semiconductor fin on opposite sides of the gate stack, wherein the first source/drain regions comprises dopants of a first conductivity type, and the second source/drain regions comprises dopants of a second conductivity type opposite the first conductivity type.

8. The semiconductor structure of claim 1, wherein the first semiconductor fin comprises Si, and the second semiconductor fin comprises SiGe.

9. The semiconductor structure of claim 1, wherein the dielectric fin comprises silicon oxide, silicon nitride, silicon oxynitride, or a combination thereof.

\* \* \* \* \*